United States Patent
Xi et al.

(10) Patent No.: US 11,183,463 B2
(45) Date of Patent: Nov. 23, 2021

(54) CHIP PACKAGE METHOD AND CHIP PACKAGE STRUCTURE

(71) Applicant: Shanghai AVIC OPTO Electronics Co., Ltd., Shanghai (CN)

(72) Inventors: Kerui Xi, Shanghai (CN); Feng Qin, Shanghai (CN); Jine Liu, Shanghai (CN); Xiaohe Li, Shanghai (CN); Tingting Cui, Shanghai (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 49 days.

(21) Appl. No.: 16/456,392

(22) Filed: Jun. 28, 2019

(65) Prior Publication Data

US 2020/0312779 A1    Oct. 1, 2020

(30) Foreign Application Priority Data

Mar. 29, 2019    (CN) .......................... 201910250625.6

(51) Int. Cl.
*H01L 23/544*    (2006.01)
*H01L 21/02*    (2006.01)
(Continued)

(52) U.S. Cl.
CPC ...... *H01L 23/544* (2013.01); *H01L 21/02118* (2013.01); *H01L 21/56* (2013.01);
(Continued)

(58) Field of Classification Search
CPC . H01L 23/544; H01L 21/02118; H01L 21/56; H01L 21/6835; H01L 23/3157;
(Continued)

(56) References Cited

U.S. PATENT DOCUMENTS

2018/0286793 A1* 10/2018 Cheng ................ H01L 24/14
2019/0385989 A1* 12/2019 Yu .................... H01L 21/6835
2020/0098693 A1*  3/2020 Jeng ................. H01L 21/76885

FOREIGN PATENT DOCUMENTS

CN    100435334 C    11/2008
CN    104465412 A     3/2015
(Continued)

*Primary Examiner* — Mohammed R Alam
(74) *Attorney, Agent, or Firm* — Anova Law Group, PLLC

(57) ABSTRACT

Chip package method and chip package structure are provided. The chip package method includes: providing a transparent substrate including a first side and a second side; coating the first side of the transparent substrate with an organic polymer material layer; depositing a protective layer on the organic polymer material layer; forming alignment parts on the protective layer; attaching a plurality of chips including metal pins; forming an encapsulating layer on the protective layer; polishing the encapsulating layer to expose the metal pins; forming a first insulating layer; forming first through holes in the first insulating layer; forming metal parts extending along sidewalls of the first through holes; and irradiating the second side of the transparent substrate by a laser to lift off the transparent substrate. The metal parts are insulated from each other and electrically connected to the metal pins.

8 Claims, 23 Drawing Sheets

(51) Int. Cl.
*H01L 21/56* (2006.01)
*H01L 21/683* (2006.01)
*H01L 23/31* (2006.01)
*H01L 23/48* (2006.01)

(52) U.S. Cl.
CPC ...... *H01L 21/6835* (2013.01); *H01L 23/3157* (2013.01); *H01L 23/481* (2013.01); *H01L 2223/54426* (2013.01)

(58) Field of Classification Search
CPC ......... H01L 23/481; H01L 2223/54426; H01L 23/3128; H01L 2221/68381; H01L 2221/68372; H01L 2221/68345; H01L 21/568; H01L 24/18; H01L 2224/18; H01L 21/50; H01L 23/3107; H01L 25/16; H01L 23/293
See application file for complete search history.

(56) References Cited

FOREIGN PATENT DOCUMENTS

| | | |
|---|---|---|
| CN | 107068669 A | 8/2017 |
| CN | 107204333 A | 9/2017 |
| CN | 107680912 A | 2/2018 |

\* cited by examiner

CHIP PACKAGE METHOD AND CHIP PACKAGE STRUCTURE

CROSS-REFERENCES TO RELATED APPLICATION

This application claims the priority of Chinese Patent Application No. 201910250625.6, filed on Mar. 29, 2019, the content of which is incorporated herein by reference in its entirety.

TECHNICAL FIELD

The present disclosure generally relates to the field of display technology and, more particularly, relates to a chip package method and a chip package structure.

BACKGROUND

Chip package usually refers to a technology of packaging integrated circuits with insulating plastic or ceramic materials. It can also refer to an outer case for mounting semiconductor integrated circuits. The chip package not only plays roles for mounting, fixing, sealing, protecting, and improving thermal conductivity of integrated circuit chips, but also provides a bridge for electrical connecting the integrated circuit chips to external circuits. Contact points of the integrated circuit chips are electrically connected to pins of the chip package case, and the pins of the chip package case are electrically connected to other devices through wires on printed circuit boards. For many integrated circuit products, a chip package technology is a very critical part.

As an integration level and volume miniaturization of integrated circuits continuously develop, a Fan-Out Wafer Level Packaging (FOWLP) technology is provided. However, the FOWLP technology has low efficiency and a high cost.

SUMMARY

One aspect of the present disclosure provides a chip package method. The method includes: providing a transparent substrate including a first side and a second side opposite to the first side; coating the first side of the transparent substrate with an organic polymer material layer; depositing a protective layer on the organic polymer material layer; forming a plurality of alignment parts on a side of the protective layer away from the organic polymer material layer; attaching a plurality of chips including a plurality of metal pins on the protective layer; forming an encapsulating layer at the side of the protective layer away from the organic polymer material layer; polishing the encapsulating layer to expose the plurality of metal pins; forming a first insulating layer; forming a plurality of first through holes in the first insulating layer; forming a plurality of metal parts extending along sidewalls of the plurality of first through holes; and irradiating the second side of the transparent substrate by a laser to lift off the transparent substrate. The plurality of metal parts is insulated from each other and is electrically connected to the plurality of metal pins.

Another aspect of the present disclosure provides a chip package structure. The structure includes: an organic polymer material layer; a protective layer covering the organic polymer material layer; a plurality of alignment parts on a side of the protective layer away from the organic polymer material layer; a plurality of chips; an encapsulating layer on the one side of the protective layer away from the organic polymer material layer; and a plurality of metal parts on a side of the encapsulating layer away from the organic polymer material layer. The plurality of chips and the plurality of alignment parts are disposed on a same side of the protective layer, and the plurality of chips includes a plurality of metal pins at a side of the plurality of chips away from the organic polymer material layer. The plurality of metal parts is electrically connected to the plurality of metal pins.

Another aspect of the present disclosure provides another chip package method. The method includes: providing a transparent substrate including a first side and a second side opposite to the first side; coating the first side of the transparent substrate with an organic polymer material layer; depositing a protective layer on the organic polymer material layer; forming a plurality of metal parts; forming a first insulating layer on a side of the protective layer away from the transparent substrate and forming a plurality of first through holes in the first insulating layer; forming a plurality of alignment parts on the first insulating layer; soldering a plurality of chips including a plurality of metal pins on the first insulating layer; forming an encapsulating layer at the side of the first insulating layer away from the organic polymer material layer; and irradiating the second side of the transparent substrate by a laser to lift off the transparent substrate. The plurality of metal parts is insulated from each other and also is insulated from the plurality of alignment parts. Along a direction perpendicular to the organic polymer material layer, each of the plurality of metal pins at least partially overlaps a corresponding one of the plurality of first through holes. Each of the plurality of metal parts extends along sidewalls of a corresponding one of the plurality of first through holes and is electrically connected to a corresponding one of the plurality of metal pins.

Another aspect of the present disclosure provides another chip package structure. The structure includes: an organic polymer material layer; a protective layer covering the organic polymer material layer; a plurality of metal parts on a side of the protective layer away from the organic polymer material layer; a plurality of alignment parts; a plurality of chips on a side of the plurality of metal parts; and an encapsulating layer on the one side of the plurality of metal parts away from the organic polymer material layer. The plurality of metal parts and the plurality of alignment parts are disposed on a same side of the organic polymer material layer. The plurality of chips is disposed on a side of the plurality of metal parts away from the organic polymer material layer and includes a plurality of metal pins at a side of the plurality of chips close to the organic polymer material layer. The plurality of metal pins is electrically connected to the plurality of metal parts.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
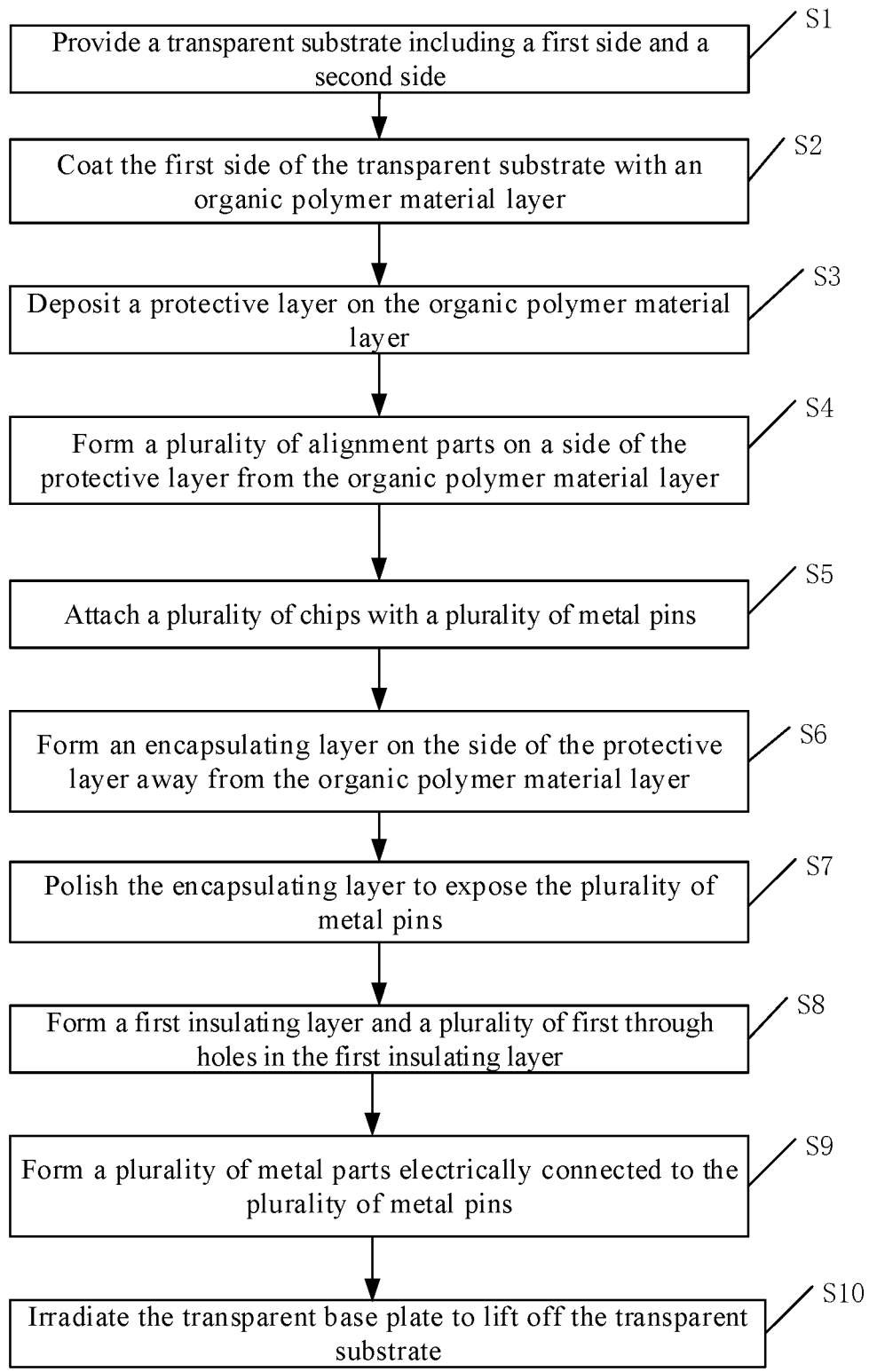
FIG. 1 illustrates an exemplary chip package method consistent with various disclosed embodiments in the present disclosure.
Figure 2:
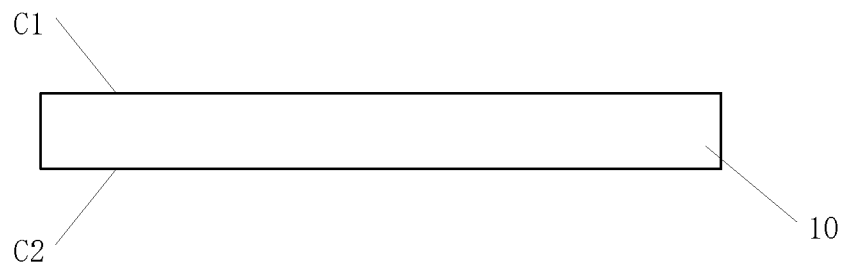
FIGS. 2-11 illustrate cross-section views of an exemplary chip package structure corresponding to different steps in the chip package method in FIG. 1 consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication, FIG. 1 illustrates an exemplary chip package method consistent with various disclosed embodiments in the present disclosure. FIGS. 2-11 illustrate cross-section views of an exemplary chip package structure corresponding to different steps in the chip package method in FIG. 1 consistent with various disclosed embodiments in the present disclosure. As illustrated in FIGS. 1-11, in one embodiment, the chip package method may include:

Step S1: providing a transparent substrate 10 including a first side C1 and a second side C2 opposite to the first side C1;

Step S2: coating the first side C1 of the transparent substrate 10 with an organic polymer material layer 11;

Step S3: depositing a protective layer 12 on the organic polymer material layer 11;

Step S4: forming a plurality of alignment parts 132 on the protective layer 12;

Step S5: attaching a plurality of chips 14 including a plurality of metal pins 141 to the protective layer 12;

Step S6: forming an encapsulating layer 15 at a side of the protective layer 12 away from the organic polymer material layer 11;

Step S7: polishing the encapsulating layer 15 to expose the plurality of metal pins 141;

Step S8: forming a first insulating layer 16 and forming a plurality of first through holes K1 in the first insulating layer;

Step S9: forming a plurality of metal parts 17; and

Step S10: irradiating the second side C2 of the transparent substrate 10 with a laser to lift off the transparent substrate 10.

Figure 3:
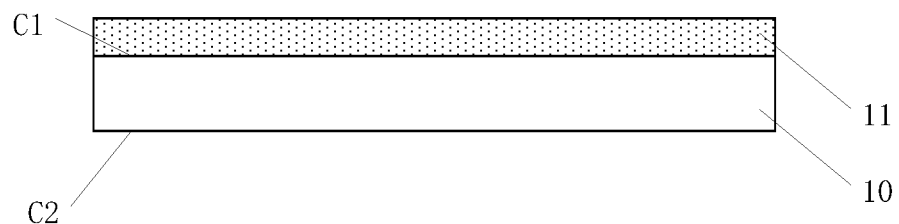

In Step S2, as illustrated in FIG. 1 and FIG. 3, the first side C1 of the transparent substrate 10 may be coated with the organic polymer material layer 11. In one embodiment, the organic polymer material layer 11 may be made of polyimide.

Figure 4:
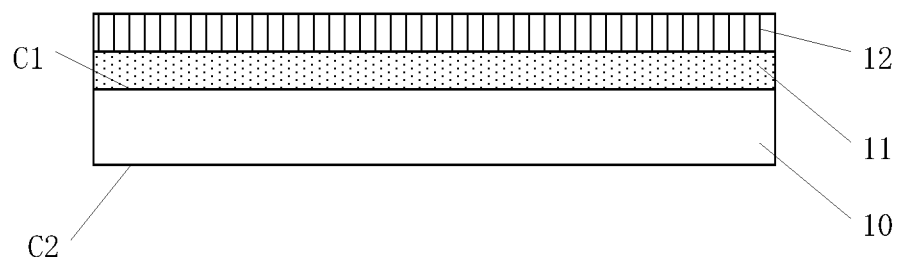

In Step S3, as illustrated in FIG. 1 and FIG. 4, the protective layer 12 may be deposited on the organic polymer material layer 11. In one embodiment, the protective layer 12 may be formed by a coating method. Correspondingly, the whole packaging structure may have a high flatness. In one embodiment, the protective layer 12 and the organic polymer material layer 11 may be made of transparent materials.

Figure 5:
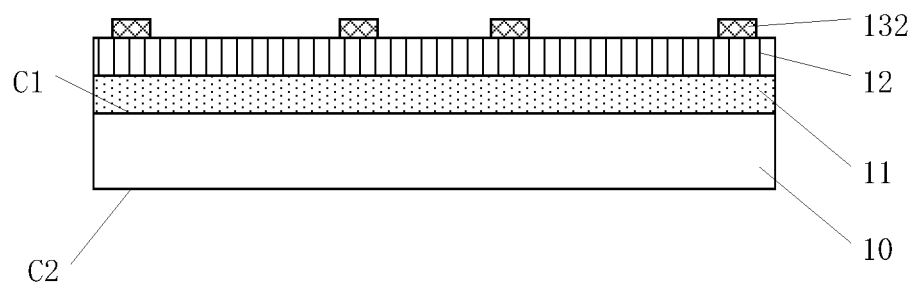
Figure 6:
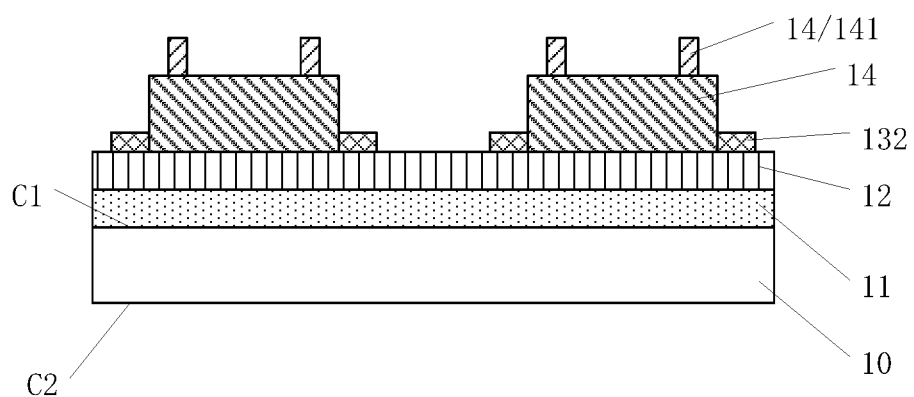

In Step S4, as illustrated in FIG. 1 and FIGS. 5-6, the plurality of alignment parts 132 may be formed on the one side of the protective layer 12 away from the organic polymer material layer 11 and the transparent substrate 10, to improve alignment accuracy of subsequent processes.

Figure 7:
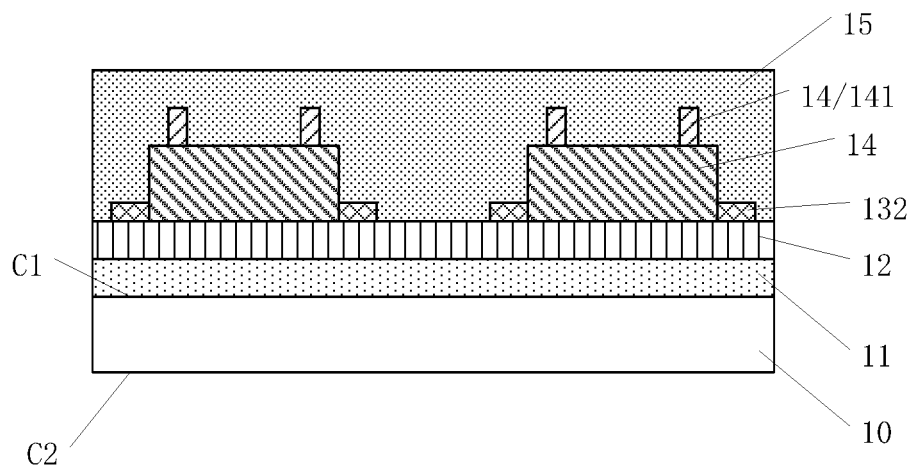

In Step S6, as illustrated in FIG. 1 and FIG. 7, the encapsulating layer 15 may be formed at the one side of the protective layer 12 away from the transparent substrate 10. The encapsulating layer 15 may prevent external matters (such as water and oxygen) from entering the plurality of chips 14, and avoid an influence of the external matters (such as water and oxygen) on a performance of the plurality of chips 14.

Figure 8:
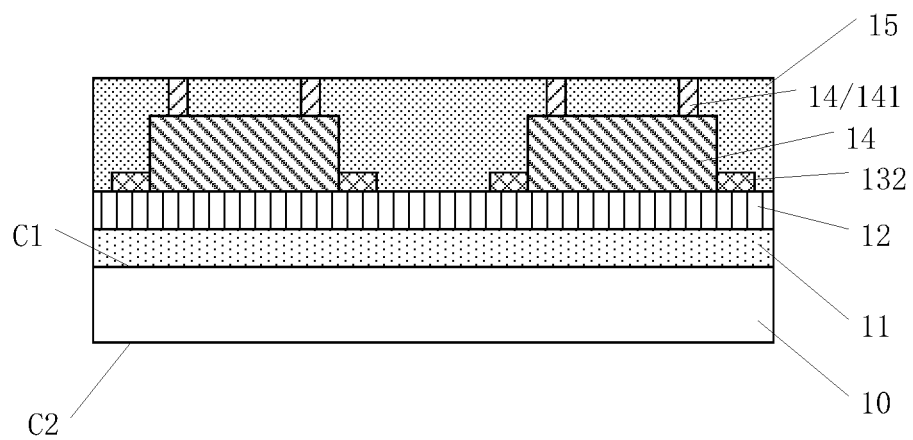

After forming the encapsulating layer 15, the plurality of chips 14 may be sealed completely by the encapsulating layer 15 and the plurality of metal pins 141 cannot be connected to external circuits. In Step S7, as illustrated in FIG. 1 and FIG. 8, the encapsulating layer 15 may be polished to expose the plurality of metal pins 141. Correspondingly, the plurality of metal pins 141 can be connected to external circuits.

Figure 9:
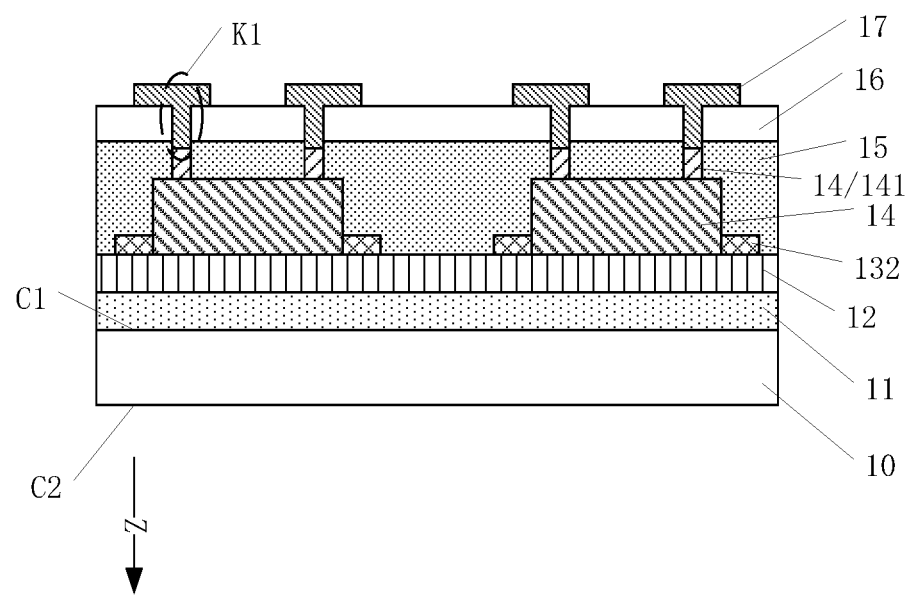

In Step S8 and Step S9 illustrated in FIG. 1 and FIG. 9, a side of the encapsulating layer 15 away from the transparent substrate 10 may be coated with the first insulating layer 16. The first insulating layer 16 may prevent short circuits between the plurality of metal parts 17 and other film layers. The first insulating layer 16 may also function as a buffer layer, and may make the flatness of the entire chip package structure more uniform. The plurality of first through holes K1 may be formed in the first insulating layer 16. Along a direction Z perpendicular to the organic polymer material layer 11, each of the plurality of first through holes K1 may at least partially overlap one of the plurality of metal pins 141. The plurality of metal parts 17 may extend along sidewalls of the plurality of first through holes K1, and may be insulated from each other. The plurality of metal parts 17 may be electrically connected to the plurality of metal pins 141 through the plurality of first through holes K1. Correspondingly, electric signals from the plurality of chips 14 may be transmitted out from the plurality of metal pins 141.

Figure 10:
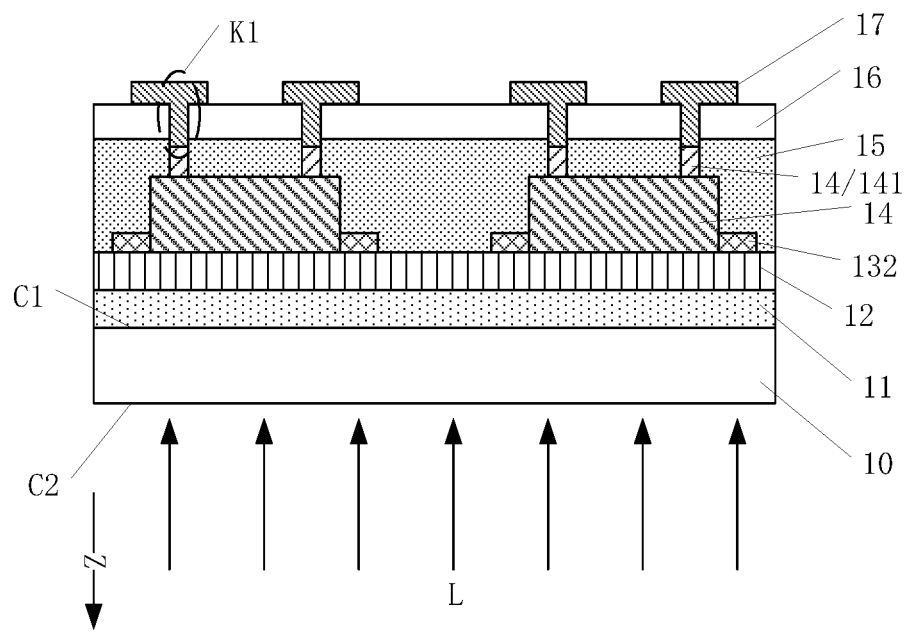
Figure 11:
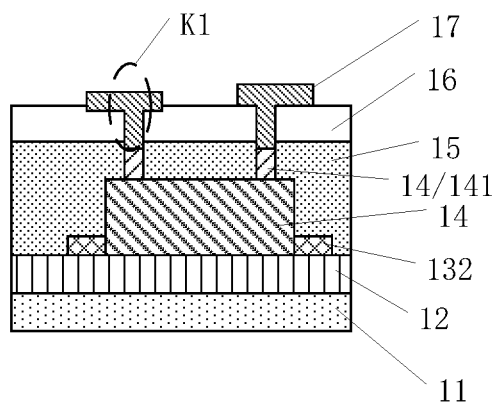

In Step S10 illustrated in FIG. 1 and FIGS. 10-11, the second side C2 of the transparent substrate 10 may be irradiated with a laser to lift off the transparent substrate 10. In one embodiment, after lifting off the transparent substrate 10, the entire chip package structure may be cut by a laser cutting method, to separate the plurality of chips 14 packaged simultaneously to a plurality of independently packaged chips.

In the chip package method provided by various embodiments of the present disclosure, the encapsulating layer may be formed directly on the organic polymer material layer and the protective layer to package the plurality of chips. After lifting off the transparent substrate, a second packaging process for a side of the plurality of chips close to the transparent substrate may be avoided. The process for the chip package may be simplified and a chip package efficiency may be improved. The plurality of alignment parts may improve the alignment accuracy and accuracy of the connection between the metal pins of the plurality of chips and the plurality of metal parts. Reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form a encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by a current technical process. The flatness of the entire chip package structure may be improved and the transparent substrate may be lifted off easily by the laser. The efficiency of the entire chip package and the good yield ratio of the chip package may be improved further.

Figure 12:
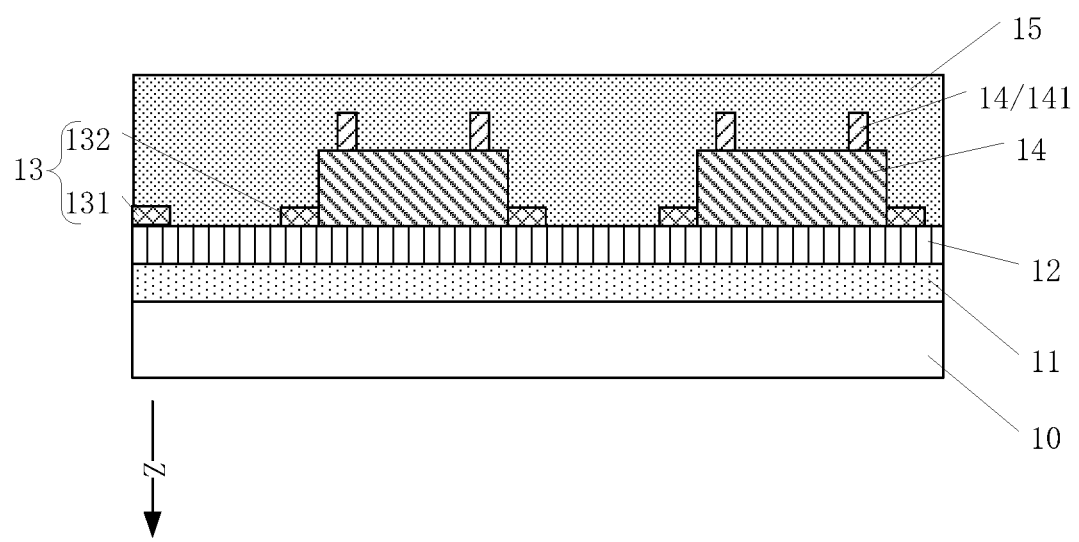
FIG. 12 illustrate a cross-section view of an exemplary chip package structure formed by the chip package method in FIG. 1 consistent with various disclosed embodiments in the present disclosure.

In one embodiment illustrated in FIG. 1 and FIG. 12, a process for forming the plurality of alignment parts 132 on the protective layer 12 may further include forming a general alignment part 131. The general alignment part 131 may be formed at the one side of the protective layer 12 away from the organic polymer material layer 11. The general alignment part 131 may be a general alignment label for the chip package process, and each of subsequent steps may be aligned according to the general alignment part 131. In one embodiment, the general alignment part 131 may be made of metal. For description purposes only, the present disclosure is illustrated by using the embodiment where the general alignment part 131 is made of metal as an example, and should not limit the scopes of the present disclosure. In various embodiments, the general alignment part 131 may be made of any suitable materials.

In the present disclosure, the general alignment part may be formed at the one side of the protective layer away from the organic polymer material layer, and each of subsequent steps may be aligned according to the general alignment part. The alignment accuracy of the chip package process may be improved. The reliability of the entire chip package structure and a good yield ratio of the chip package process may be improved.

In one embodiment illustrated in FIG. 12, each of the plurality of chips 14 may be in contact with at least two of the plurality of alignment parts 132, and the at least two of the plurality of alignment parts 132 may be at two different sides of the one of the plurality of chips 14.

As illustrated in FIG. 12, the plurality of alignment parts 132 may be formed at the one side of the protective layer 12 away from the transparent substrate 10. The plurality of alignment parts 132 may be used as dedicated alignment marks for the plurality of chips. When attaching the plurality of chips 14, the plurality of chips 14 may be attached precisely according to positions of the plurality of alignment parts 132. The attachment accuracy of the plurality of chips may be improved. The reliability of the entire chip package structure and a good yield ratio of the chip package process may be improved. In one embodiment, the plurality of alignment parts 132 may be made of metal. For description purposes only, the present disclosure is illustrated by using the embodiment where the plurality of alignment parts 132 is made of metal as an example, and should not limit the scopes of the present disclosure. In various embodiments, the plurality of alignment parts 132 may be made of any suitable materials.

In the present disclosure, the plurality of alignment parts 132 may be formed at the one side of the protective layer 12 away from the transparent substrate 10. The attachment accuracy of the plurality of chips may be improved, and the plurality of metal parts may be attached to the plurality of metal pins precisely. The reliability of the entire chip package structure and a good yield ratio of the chip package process may be improved.

Figure 13:
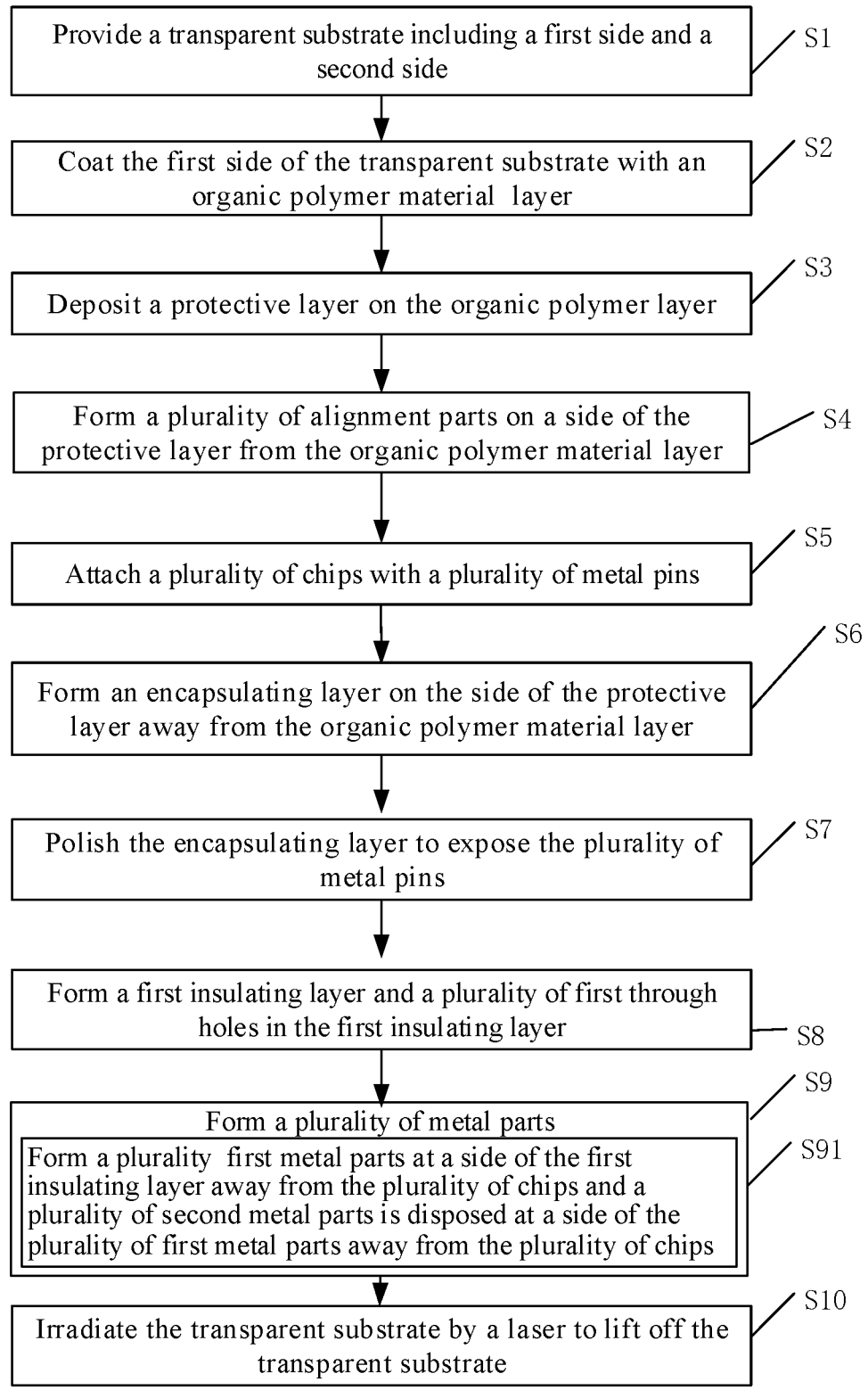
FIG. 13 illustrates another exemplary chip package method consistent with various disclosed embodiments in the present disclosure.
Figure 14:
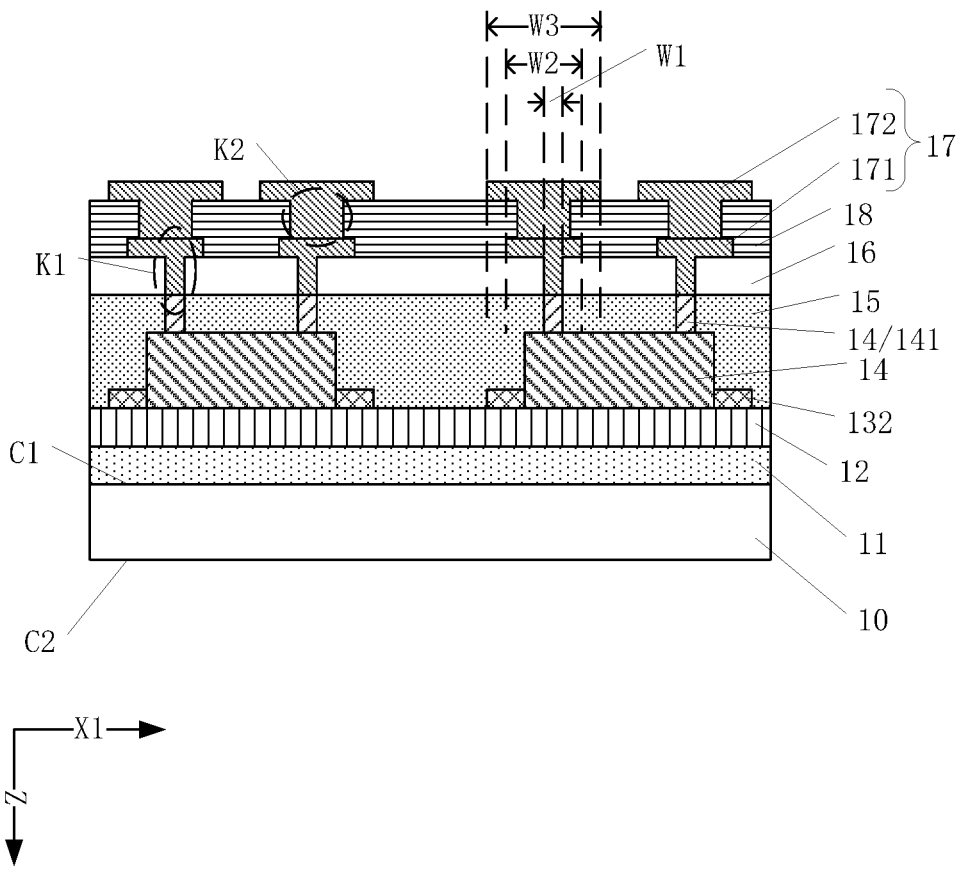
FIG. 14 illustrates a cross-section view of an exemplary chip package structure corresponding the chip package method in FIG. 13 consistent with various disclosed embodiments in the present disclosure.

FIG. 13 illustrates another exemplary chip package method provided by one embodiment in the present disclosure; and FIG. 14 illustrates a cross-section view of an exemplary chip package structure corresponding to the chip package method in FIG. 13. In one embodiment illustrated in FIGS. 13-14, the process for forming the plurality of metal parts 17 may include Step S91: forming a plurality of first metal parts 171 and a plurality of second metal parts 172. The plurality of first metal parts 171 may be formed at a side of the first insulating layer 161 away from the plurality of chips 14, and the plurality of second metal parts 172 may be formed at a side of the plurality of first metal parts 171 away from the plurality of chips 14. A second insulating layer 18 may be formed between the plurality of first metal parts 171 and the plurality of second metal parts 172. A plurality of second through holes K2 may be formed in the second insulating layer 18. Along the direction perpendicular to the organic polymer material layer 11, each of the plurality of first metal parts 171 may at least partially overlap corresponding one of the plurality of metal pins 141, and each of the plurality of second metal parts 172 may at least partially overlap corresponding one of the plurality of first metal parts 171. Each of the plurality of second metal parts 172 may be electrically connected to the corresponding one of the plurality of first metal parts 171 through corresponding one of the plurality of second through holes K2.

In the present disclosure, the process for forming the plurality of metal parts 17 may include forming the plurality of first metal parts 171 and the plurality of second metal parts 172. The second insulating layer 18 may be formed between the plurality of first metal parts 171 and the plurality of second metal parts 172. Each of the plurality of second metal parts 172 may be electrically connected to the corresponding one of the plurality of first metal parts 171, and each of the plurality of first metal parts 171 may be electrically connected to corresponding one of the plurality of metal pins 141 to transmit electric signals from the plurality of chips 14. Along a direction X1 parallel to the transparent substrate 10, a width W3 of the plurality of second metal parts 172 may be larger than a width W2 of the plurality of first metal parts 171, and the width W2 of the plurality of first metal parts 171 may be larger than a width W1 of the plurality of metal pins 141. The plurality of second metal parts 172 with the larger width W2 may provide a larger contact area. Correspondingly, transmission of electric signal when connecting the packaged chips to other circuits and/or products may be more stable and accurate.

In the present disclosure, when electrically connecting the packaged chips to other circuits and/or products, the plurality of second metal parts may provide a large contact area. Correspondingly, transmitted electric signals may be more accurate and usability of the chip package structure may be improved.

Figure 15:
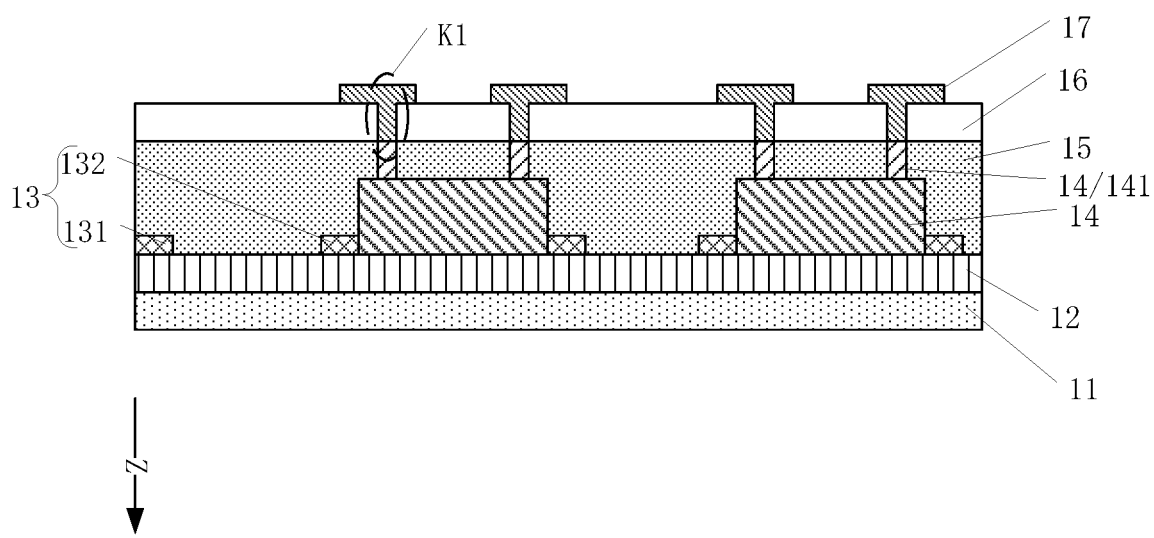
FIG. 15 illustrates a cross-section view of an exemplary chip package structure consistent with various disclosed embodiments in the present disclosure.

In one embodiment, the present disclosure provides a chip package structure formed by a chip package method provided by various embodiments of the present disclosure. FIG. 15 illustrates a cross-section view of an exemplary chip package structure provided by an embodiment in the present disclosure. As illustrated in FIG. 15, the chip package structure may include: an organic polymer material layer 11, a protective layer 12 covering the organic polymer material layer 11; a plurality of alignment parts 132 at a side of the protective layer 12 away from the organic polymer material layer 11; a plurality of chips 14; an encapsulating layer 151 at the one side of the protective layer 12 away from the organic polymer material layer 11; and a plurality of metal parts 17. The plurality of chips 14 and the plurality of alignment parts 132 may be disposed at a same side. The plurality of chips 14 may include a plurality of metal pins 141 at a side of the plurality of chips 141 away from the organic polymer material layer 11. The plurality of metal parts 17 may be disposed at a side of the encapsulating layer 15 away from the organic polymer material layer 11, and may be electrically connected to the plurality of metal pins 141.

In the chip package structure provided by various embodiments of the present disclosure, the organic polymer material layer 11 and the protective layer 12 may be used to substitute the encapsulating layer 15 at another side of the plurality of chips 14 without the plurality of metal pins 141. In one embodiment, the organic polymer material layer 11 may be made of polyimide. The organic polymer material layer 11 may be made of a coating method or another suitable method, and the whole packaging structure may have a high flatness after depositing the protective layer 12 on the organic polymer material layer 11. In one embodiment, the protective layer 12 and the organic polymer material layer 11 may be made of transparent materials. The plurality of alignment parts 132 may be formed on the one side of the protective layer 12 away from the organic polymer material layer 11, to improve alignment accuracy of subsequent processes. The encapsulating layer 15 may be formed at the one side of the protective layer 12 away from the organic polymer material layer 11. In one embodiment, the encapsulating layer 15 may be made of epoxy molding compound (EMC). The encapsulating layer 15 may prevent external matters (such as water and oxygen) from entering the plurality of chips 14, and avoid the influence of the external matters (such as water and oxygen) on the performance of the plurality of chips 14.

In the chip package structure provided by various embodiments of the present disclosure, the encapsulating layer may be formed directly on the organic polymer material layer and the protective layer to package the plurality of chips. After lifting off the transparent substrate, a second packaging process at a side of the plurality of chips close to the transparent substrate with EMC may be avoided. The process for the chip package may be simplified and a chip package efficiency may be improved. The plurality of alignment parts may improve the alignment accuracy and accuracy of the connection between the metal pins of the plurality of chips and the plurality of metal parts. Reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form a encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by current technical process. The flatness of the entire chip package structure may be improved and the transparent substrate may be lifted off easily by the laser. The efficiency of the entire chip package and the good yield ratio of the chip package may be improved further.

In one embodiment illustrated in FIG. 15, each of the plurality of chips 14 may be in contact with at least two of the plurality of alignment parts 132, and the at least two of the plurality of alignment parts 132 may be at two different sides of the one of the plurality of chips 14.

In one embodiment illustrated in FIG. 15, a general alignment part 131 and the plurality of alignment parts 132 may be disposed at the one side of the protective layer 12 away from the transparent substrate 10. The general alignment part 131 may be used as a general alignment mark for the chip package process, and each of subsequent steps may be aligned according to the general alignment part 131. In one embodiment, the general alignment part 131 and the plurality of alignment parts 132 may be made of metal. For description purposes only, the present disclosure is illustrated by using the embodiment where the general alignment part 131 and the plurality of alignment parts 132 are made of metal as an example, and should not limit the scopes of the present disclosure. In various embodiments, the general alignment part 131 and the plurality of alignment parts 132 may be made of any suitable materials.

In the present disclosure, the general alignment part may be formed at the one side of the protective layer away from the organic polymer material layer, and each of subsequent steps may be aligned according to the general alignment part. The alignment accuracy of the chip package process may be improved. The reliability of the entire chip package structure and a good yield ratio of the chip package process may be improved.

In one embodiment illustrated in FIG. 15, the protective layer 12 may be made of a silicon-containing material including, e.g., a silicide. The protective layer 12 made of a silicide may have a small thickness to decrease the thickness of the chip package structure. The silicide may effectively isolate water and/or oxygen, and also have a good light transmission. Correspondingly, damage on the film layer structure when cutting/separating the plurality of chips may be avoided and a good yield ratio of the chip package process may be improved.

Figure 16:
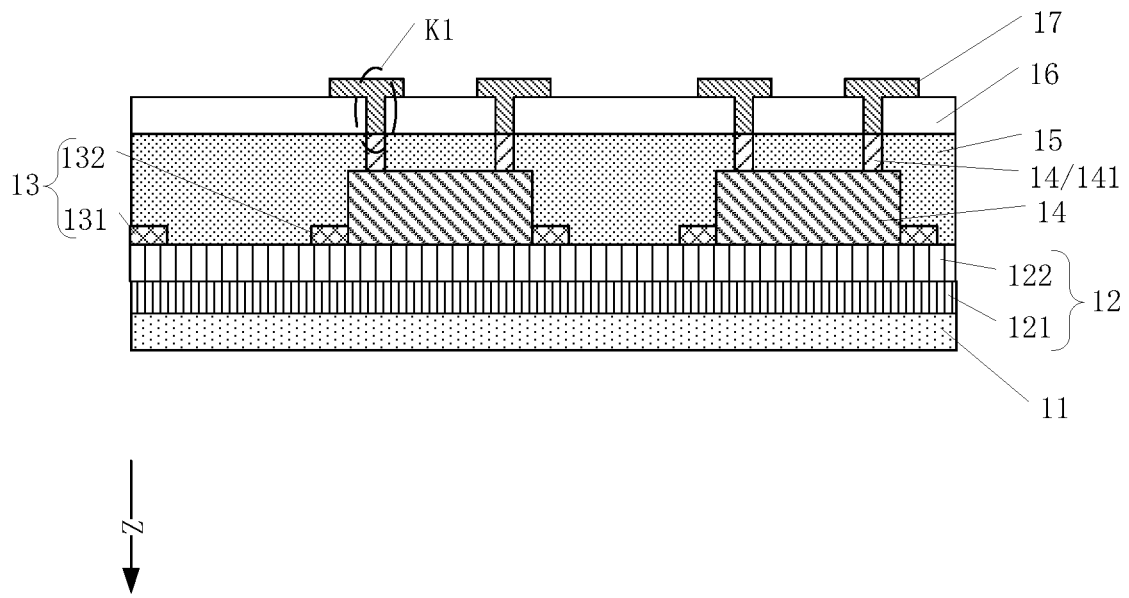
FIG. 16 illustrates a cross-section view of another exemplary chip package structure consistent with various disclosed embodiments in the present disclosure.

In another embodiment illustrated in FIG. 16, the protective layer 12 may include a first protective layer 121 and a second protective layer 122. The first protective layer 121 may be made of a silicon-containing material including silicides such as $SiO_2$ and SiN. The second protective layer 122 may be made of plastics. In one embodiment, the second protective layer 122 and the encapsulating layer 15 may be made of a same material. In another embodiment, the organic polymer material layer 11 may be multiplexed as a third protective layer. The organic polymer material layer 11 may be made of a flexible material such as polyimide and could be used as a buffer/protective layer.

In the present disclosure, the protective layer 12 may include the first protective layer 121 and the second protective layer 122. External matters (such as water and oxygen) may be effectively prevented from entering the plurality of chips 14. Correspondingly, reliability of the chip package structure may be improved and a life of the plurality of chips may be extended.

The encapsulating layer 15 may be made of a material including plastic. In one embodiment illustrated in FIG. 16, the encapsulating layer 15 may be made of epoxy molding compound (EMC). The encapsulating layer 15 may prevent external matters (such as water and oxygen) from entering the plurality of chips 14, and avoid the influence of the external matters (such as water and oxygen) on the performance of the plurality of chips 14.

In the present disclosure, the encapsulating layer may be made of plastic. Plastic technologies are mature, and a chip package cost may be reduced. External matters (such as water and oxygen) may be effectively prevented from entering the plurality of chips 14. Correspondingly, the reliability of the chip package structure may be improved and the life of the plurality of chips may be extended.

Figure 17:
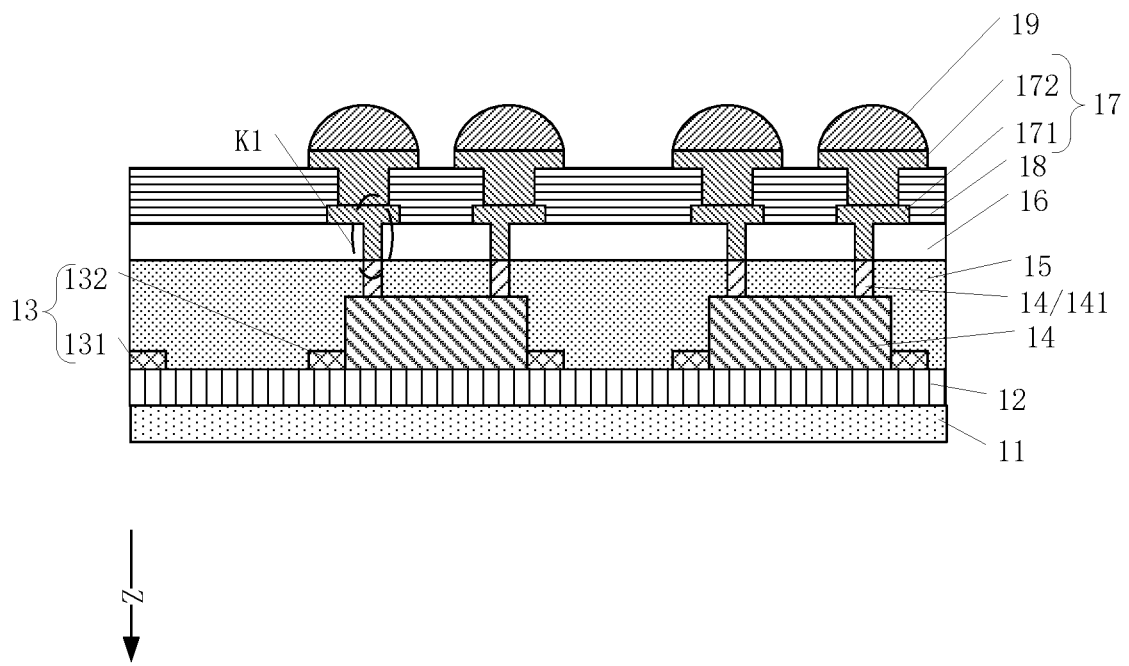
FIG. 17 illustrates a cross-section view of another exemplary chip package structure consistent with various disclosed embodiments in the present disclosure.

In another embodiment illustrated in FIG. 17, the chip package structure may further include metal balls 19. The metal balls 19 may be disposed on the one side of the plurality of metal parts 17 away from the organic polymer material layer 11.

In the present disclosure, the metal balls 19 may be disposed on the one side of the plurality of metal parts 17 away from the organic polymer material layer 11. Correspondingly, the packaged chips may be soldered to circuit boards and/or other circuits conveniently, and a usability of the packaged chips may be facilitated.

Figure 18:
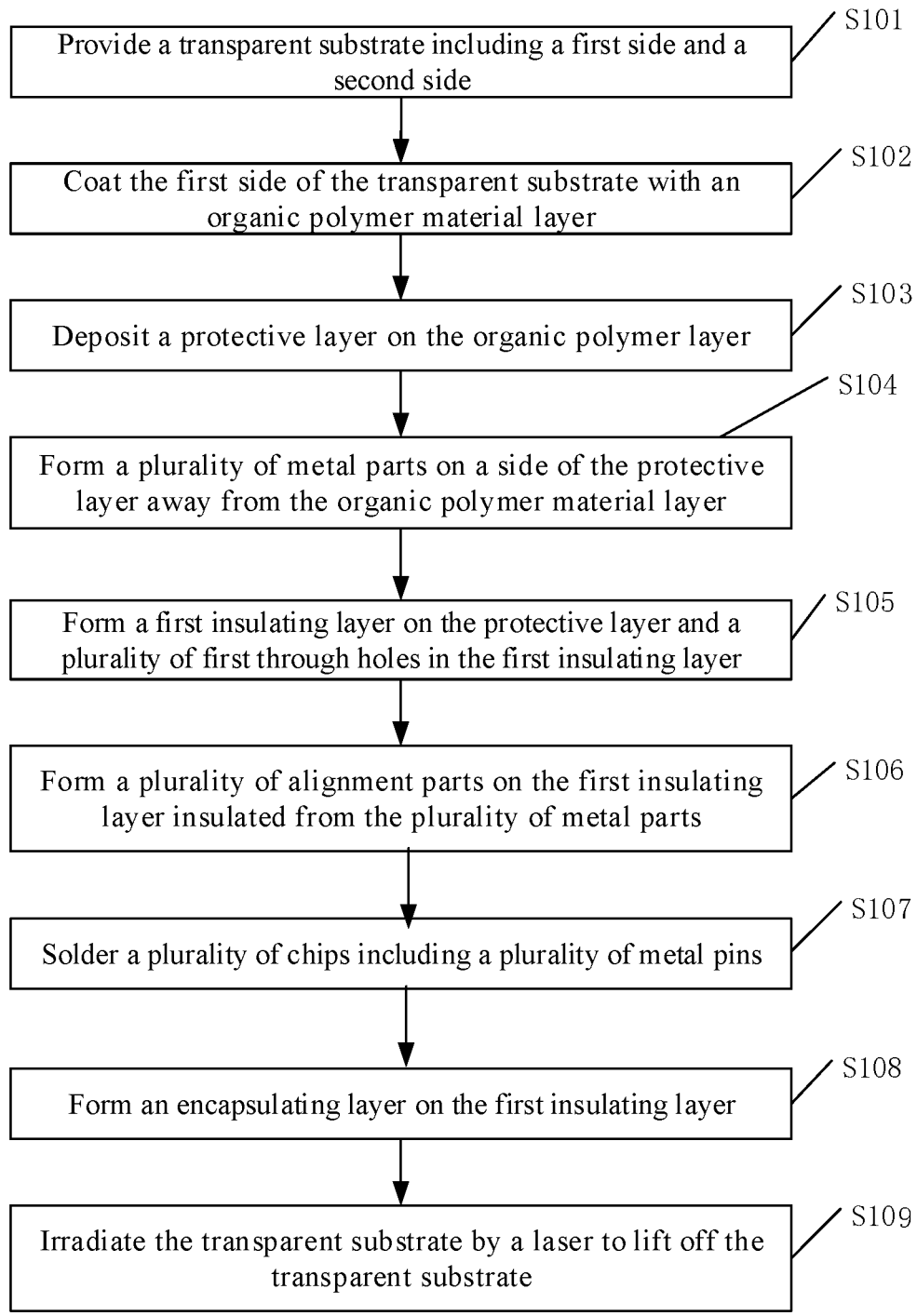
FIG. 18 illustrates another exemplary chip package method consistent with various disclosed embodiments in the present disclosure.

In another embodiment, the present disclosure also provides another chip package method. FIG. 18 illustrates another chip package method consistent with various disclosed embodiments in the present disclosure. FIGS. 19-28 illustrate cross-section views of the chip package structure corresponding to different steps in the chip package method in FIG. 18. As illustrated in FIGS. 18-28, the chip package method may include:

Step S101: providing a transparent substrate 10 including a first side C1 and a second side C2 opposite to the first side C1;

Step S102: coating the first side C1 of the transparent substrate 10 with an organic polymer material layer 11;

Step S103: depositing a protective layer 12 on the organic polymer material layer 11;

Step S104: forming a plurality of metal parts 17 on the protective layer 12;

Step S105: forming a first insulating layer 16 on a side of the protective layer 12 away from the transparent substrate 10, and forming a plurality of first through holes K1 in the first insulating layer 16;

Step S106: forming a plurality of alignment parts 132 on the first insulating layer 16;

Step S107: soldering a plurality of chips 14 including a plurality of metal pins 141;

Step S108: forming an encapsulating layer 15 at a side of the first insulating layer 16 away from the organic polymer material layer 11; and Step S109: irradiating the second side C2 of the transparent substrate 10 with a laser L to lift off the transparent substrate 10.

Figure 20:
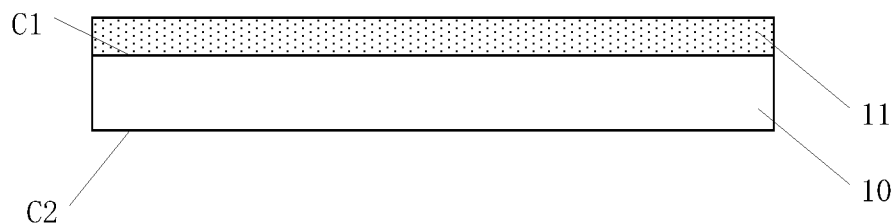

In Step S102, as illustrated in FIG. 18 and FIG. 20, the first side C1 of the transparent substrate 10 may be coated with the organic polymer material layer 11. In one embodiment, the organic polymer material layer 11 may be made of a material including polyimide.

Figure 21:
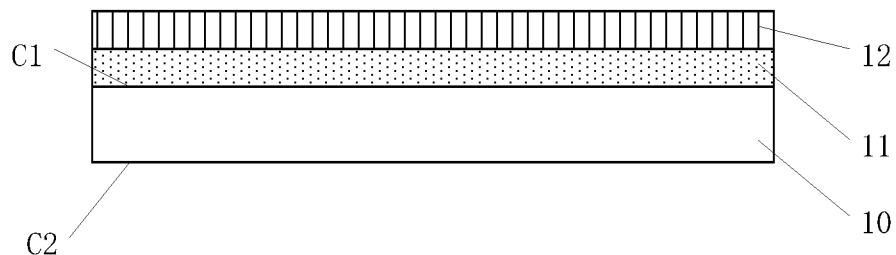

In Step S103, as illustrated in FIG. 18 and FIG. 21, the protective layer 12 may be deposited on the organic polymer material layer 11. In one embodiment, the protective layer 12 may be formed by a coating method. Correspondingly, the whole packaging structure may have a high flatness. In one embodiment, the protective layer 12 and the organic polymer material layer 11 may be made of transparent materials.

Figure 22:
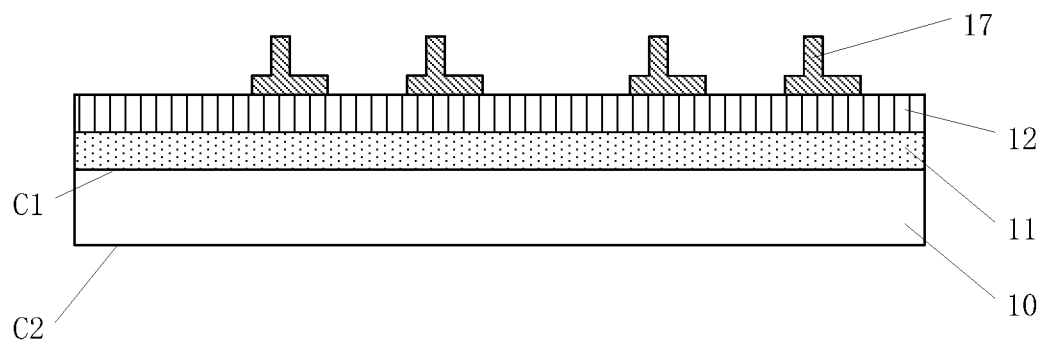

In Step S104, as illustrated in FIG. 18 and FIG. 22, the plurality of metal parts 17 may be formed on the one side of the protective layer 12 away from the transparent substrate 10. The plurality of metal parts 17 may be insulated from each other.

Figure 23:
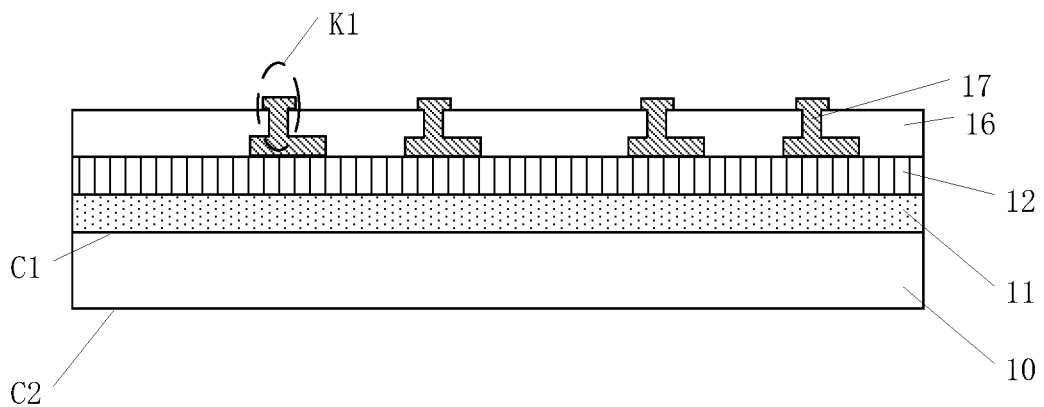

In Step S105, as illustrated in FIG. 18 and FIG. 23, a side of the plurality of metal parts 17 away from the transparent substrate 10 may be coated with the first insulating layer 16. The first insulating layer 16 may prevent short circuits between the plurality of metal parts 17 and other film layers. The first insulating layer 16 may also function as a buffer layer and may make the flatness of the entire chip package structure more uniform. The plurality of first through holes K1 may be formed in the first insulating layer 16. In one embodiment, an area of one of the plurality of metal parts 17 at the one side of the plurality of metal parts 17 away from the transparent substrate 10 may be larger than an area of a corresponding one of the plurality of metal pins 141, to guarantee an adequate contact area between the one of the plurality of metal parts 17 and the corresponding one of the plurality of metal pins 141.

Figure 24:
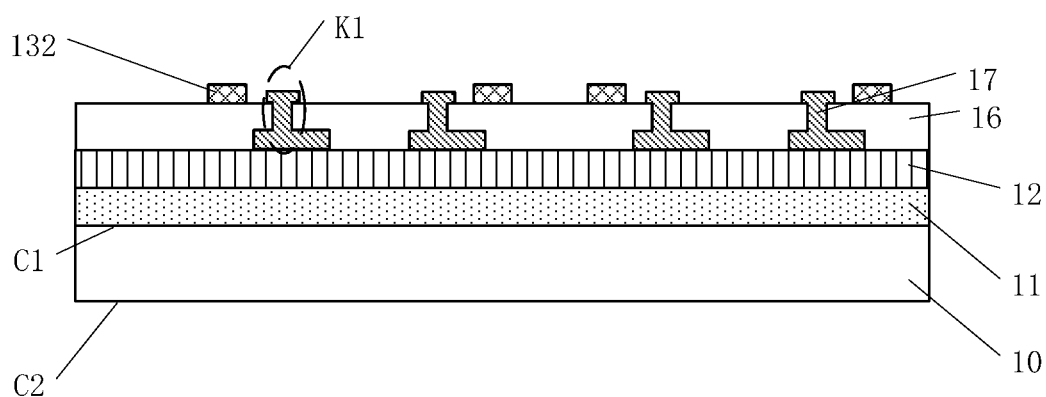

In Step S106, as illustrated in FIG. 18 and FIG. 24, the plurality of alignment parts 132 may be formed at the one side of the first insulating layer 16 away from the transparent substrate 10. The plurality of alignment parts 132 may be used as dedicated alignment marks for the plurality of chips. When attaching the plurality of chips 14, the plurality of chips 14 may be attached precisely according to positions of the plurality of alignment parts 132. The attachment accuracy of the plurality of chips may be improved. The reliability of the entire chip package structure and a good yield ratio of the chip package process may be improved. In one embodiment, the plurality of alignment parts 132 may be made of metal. For description purposes only, the present disclosure is illustrated by using the embodiment where the plurality of alignment parts 132 is made of metal as an example and should not limit the scopes of the present disclosure. In various embodiments, the plurality of alignment parts 132 may be made of any suitable materials.

Figure 25:
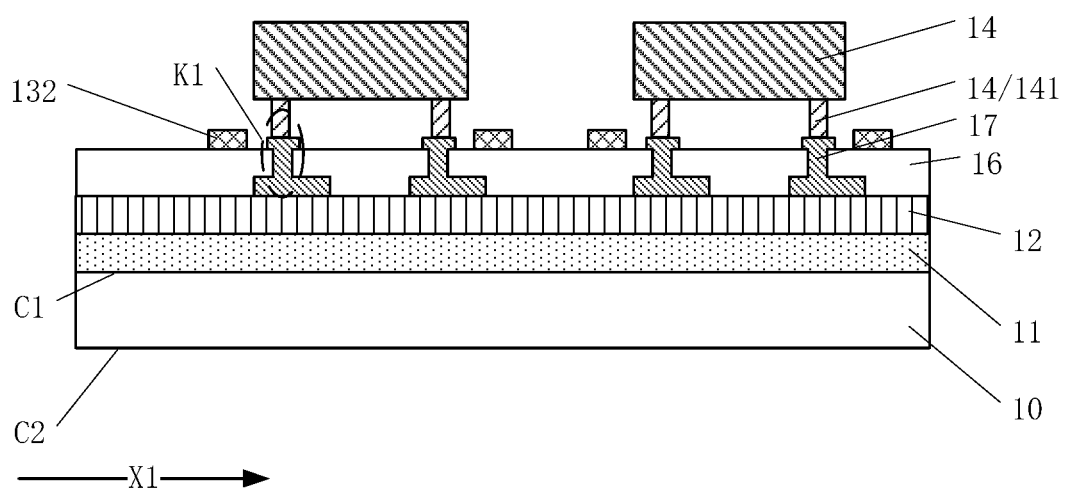

In Step S107, as illustrated in FIG. 18 and FIG. 25, along a direction Z perpendicular to the organic polymer material layer 11, each of the plurality of first through holes K1 may at least partially overlap a corresponding one of the plurality of metal pins 141. The plurality of metal parts 17 may extend along sidewalls of the plurality of first through holes K1, and may be insulated from each other. The plurality of metal parts 17 may be electrically connected to the plurality of metal pins 141 through the plurality of first through holes K1. In one embodiment, along a direction X1 parallel to the transparent substrate 10, a width of one of the plurality of metal parts 17 at another side of the plurality of metal parts 17 close to the plurality of metal pins 141 and at a position of the electrical connection between the one of the plurality of metal parts 17 and the corresponding one of the plurality of metal pins 141, may be larger than a width of the corresponding one of the plurality of metal pins 141, to guarantee an adequate contact area between the one of the plurality of metal parts 17 and the corresponding one of the plurality of metal pins 141. Reliability of signal transmission may be improved.

Figure 26:
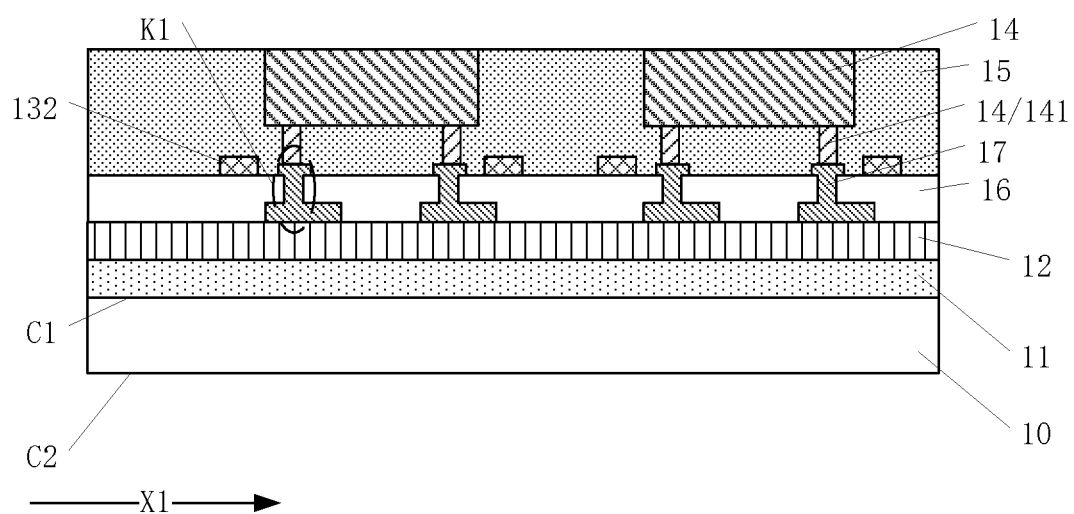

In Step S108, as illustrated in FIG. 18 and FIG. 26, the encapsulating layer 15 may be formed to prevent external matters (such as water and oxygen) from entering the plurality of chips 14, and avoid the influence of the external matters (such as water and oxygen) on the performance of the plurality of chips 14.

Figure 27:
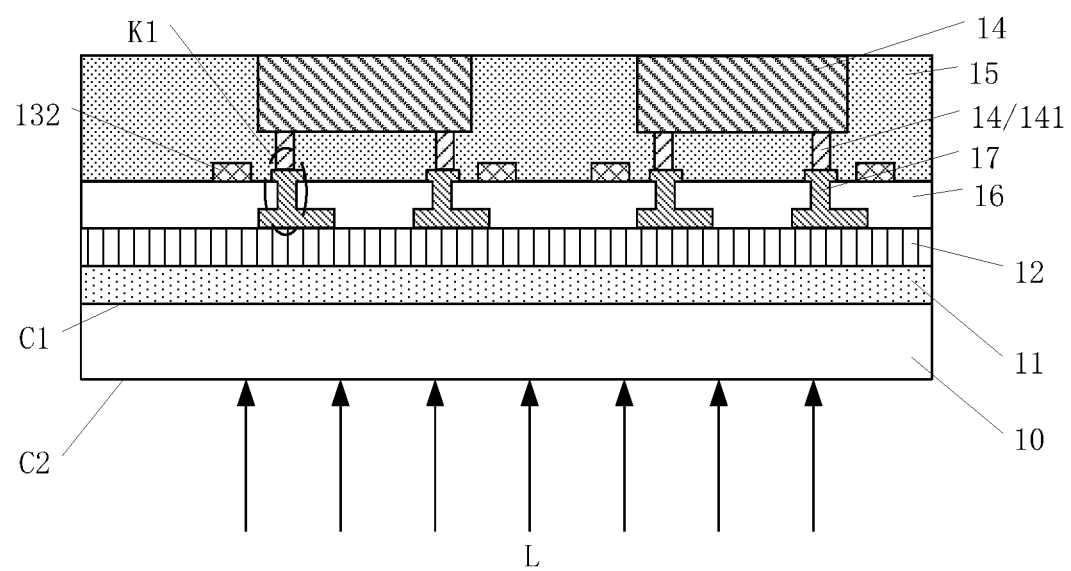
Figure 28:
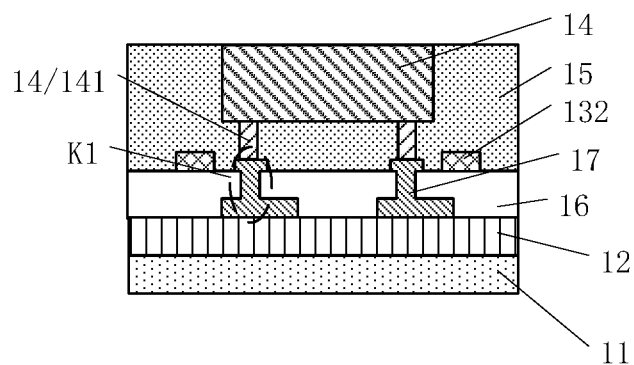

In Step S109 illustrated in FIG. 18 and FIGS. 27-28, the second side C2 of the transparent substrate 10 may be irradiated with a laser L to lift off the transparent substrate 10. In one embodiment, after lifting off the transparent substrate 10, the entire chip package structure may be cut by a laser cutting method, to separate the plurality of chips 14 packaged at a same time to a plurality of independently packaged chips.

In the chip package method provided by various embodiments of the present disclosure, the encapsulating layer may be formed directly on the organic polymer material layer and the protective layer to package the plurality of chips. After lifting off the transparent substrate, a second packaging process for a side of the plurality of chips close to the transparent substrate may be avoided. The process for the chip package may be simplified and a chip package efficiency may be improved. The plurality of alignment parts may improve the alignment accuracy and accuracy of the connection between the metal pins of the plurality of chips and the plurality of metal parts. Reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form a encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by current technical process. The flatness of the entire chip package structure may be improved and the transparent substrate may be lifted off easily by the laser. The efficiency of the entire chip package and the good yield ratio of the chip package may be improved further.

Figure 19:
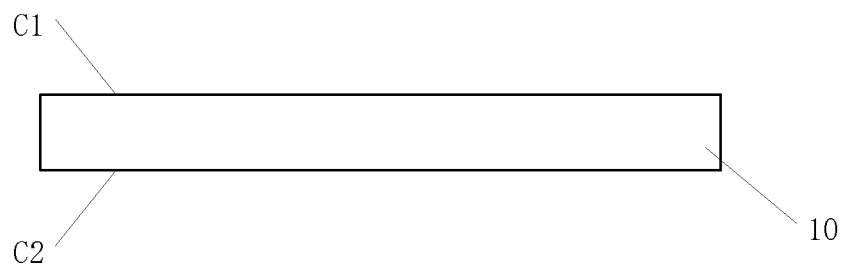
FIGS. 19-28 illustrate cross-section views of an exemplary chip package structure corresponding to different steps in the chip package method in FIG. 18 consistent with various disclosed embodiments in the present disclosure.
Figure 29:
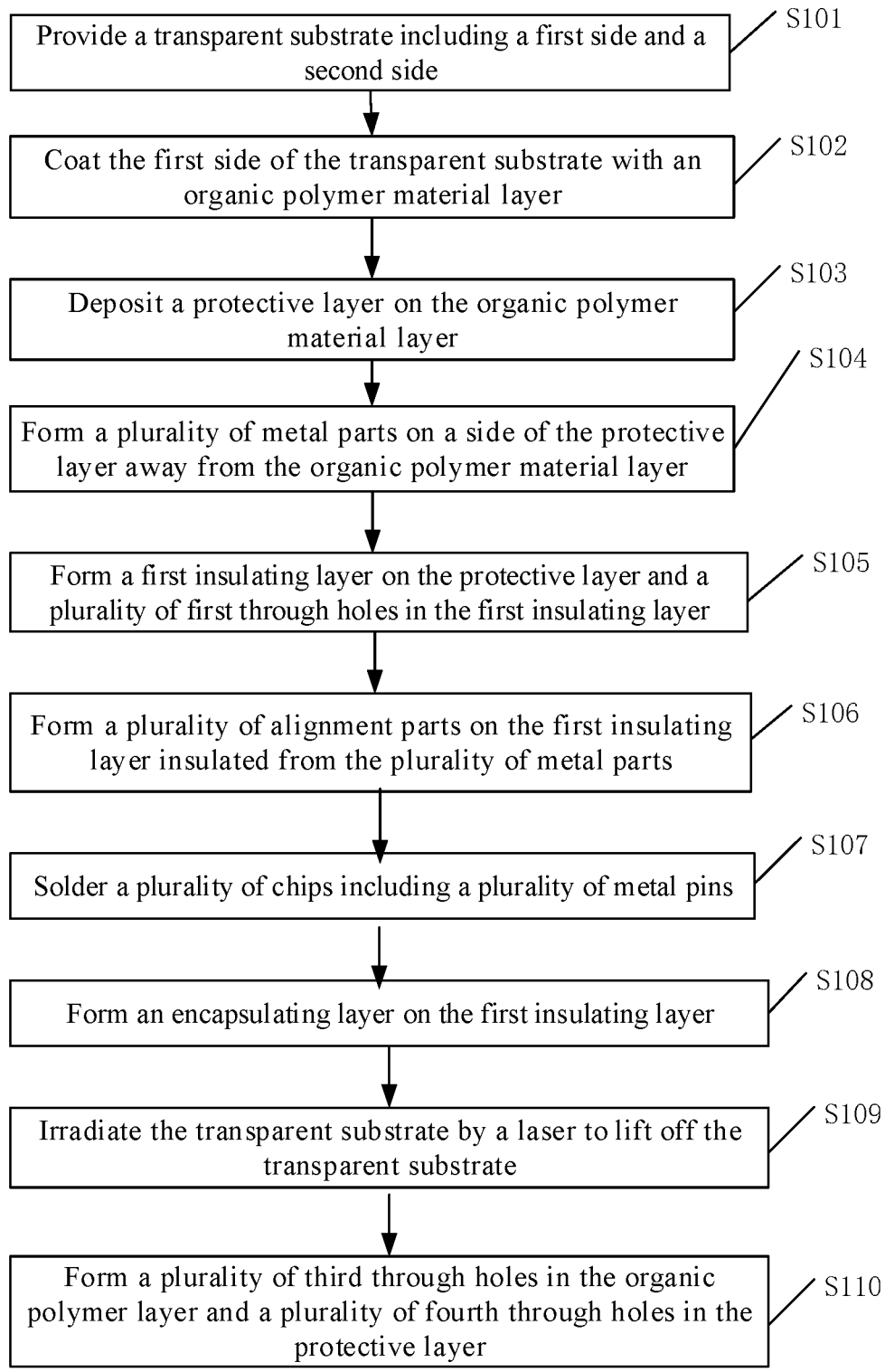
FIG. 29 illustrates another exemplary chip package method consistent with various disclosed embodiments in the present disclosure.
Figure 30:
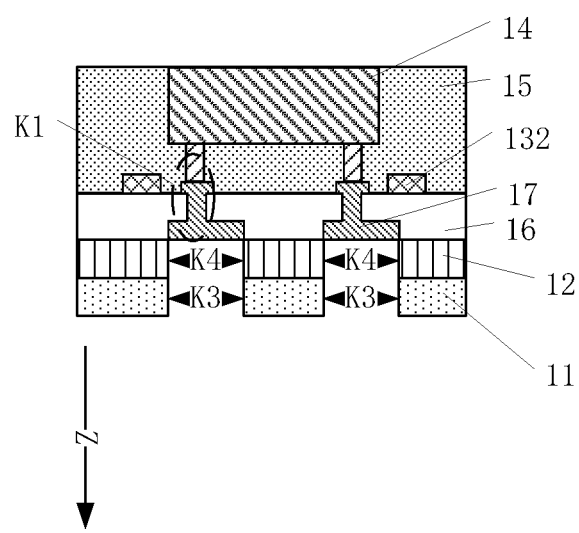
FIG. 30 illustrates a cross-section view of an exemplary chip package structure corresponding the chip package method in FIG. 29 consistent with various disclosed embodiments in the present disclosure.

Another embodiment of the present disclosure provides another chip package method illustrated in FIGS. 29-30. FIG. 19 illustrates another chip package method and FIG. 30 illustrates a cross-section view of the chip package structure corresponding to the chip package method in FIG. 29. As illustrated in FIGS. 29-30, the chip package method may further include:

Step S110: forming a plurality of third through holes K3 in the organic polymer material layer 11 and a plurality of fourth through holes K4 in the protective layer 12.

Along the direction Z perpendicular to the organic polymer material layer 11, each of the plurality of third through holes K3 may at least partially overlap a corresponding one of the plurality of metal parts 17, and each of the plurality of fourth through holes K4 may overlap a corresponding one of the plurality of third through holes K3.

As illustrated in FIGS. 29-30, the plurality of third through holes K3 and the plurality of fourth through holes K4 may be formed in the organic polymer material layer 11 and in the protective layer 12 respectively to expose the plurality of metal parts 17. Correspondingly, the plurality of metal parts 17 could be used to transmit the electric signals from the plurality of chips 14.

In the present disclosure, through holes may be formed in the organic polymer material layer 11 and in the protective layer 12 respectively to expose the plurality of metal parts 17. Correspondingly, the plurality of metal parts 17 could be used to transmit the electric signals from the plurality of chips 14. The forming process may be simple. The organic polymer material layer and the protective layer may prevent external matters such as water and oxygen from entering the chip package structure, and a packaging validity may be improved.

Figure 31:
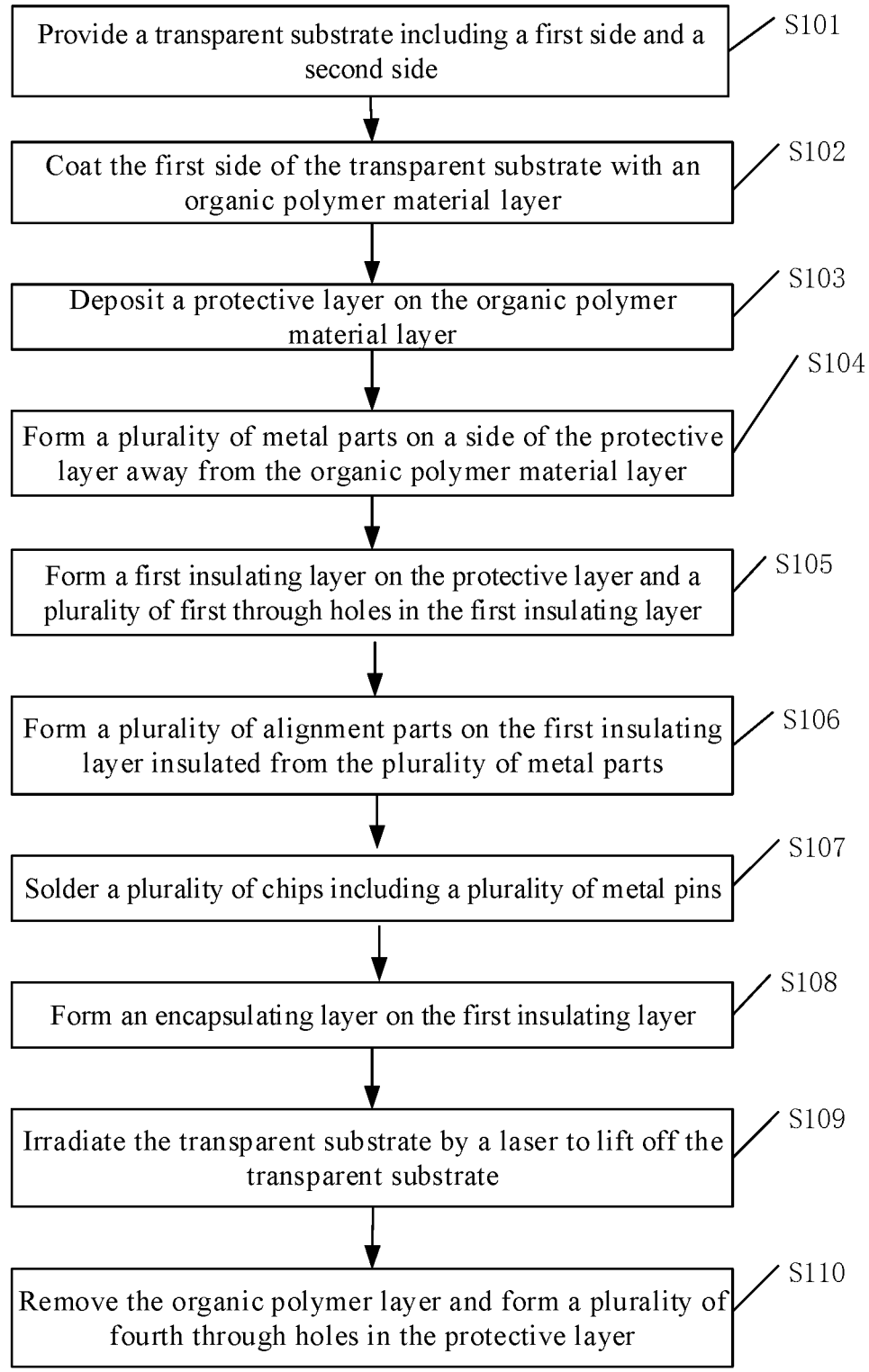
FIG. 31 illustrates another exemplary chip package method consistent with various disclosed embodiments in the present disclosure.
Figure 32:
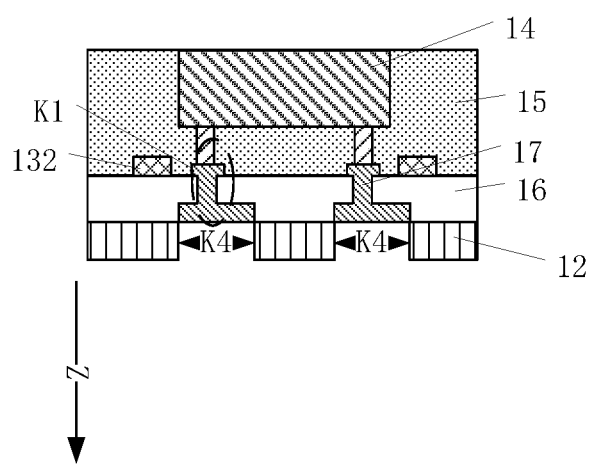
FIG. 32 illustrates a cross-section view of an exemplary chip package structure corresponding to the chip package method in FIG. 31 consistent with various disclosed embodiments in the present disclosure.

Another embodiment of the present disclosure provides another chip package method illustrated in FIGS. 31-32. FIG. 31 illustrates another chip package method and FIG. 32 illustrates a cross-section view of the chip package structure corresponding to the chip package method in FIG. 31. As illustrated in FIGS. 31-32, the chip package method may further include:

Step S111: lifting off the organic polymer material layer 11 and forming a plurality of fourth through hole K4 in the protective layer 12.

Along the direction Z perpendicular to the plurality of chips 14, each of the plurality of fourth through holes K4 may at least partially overlap a corresponding one of the plurality of metal parts 17.

As illustrated in FIGS. 31-32, the plurality of fourth through holes K4 may be formed in the protective layer 12 by a method including a polishing process, to expose the plurality of metal parts 17. Correspondingly, the plurality of metal parts 17 could be used to transmit the electric signals from the plurality of chips 14

In the present disclosure, the protective layer may prevent external matters such as water and oxygen from entering the chip package structure, and a packaging validity may be improved.

Figure 33:
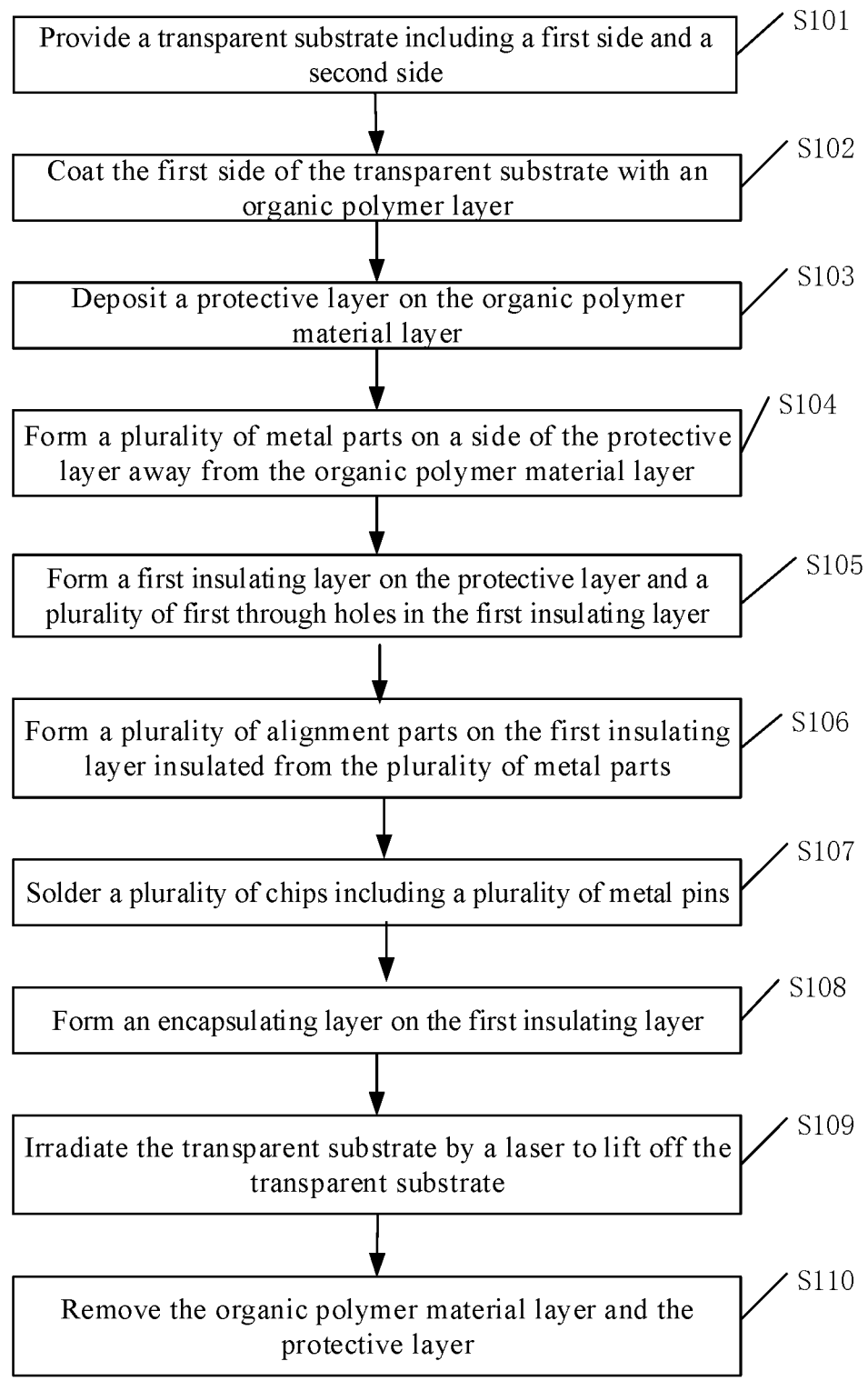
FIG. 33 illustrates another exemplary chip package method consistent with various disclosed embodiments in the present disclosure.
Figure 34:
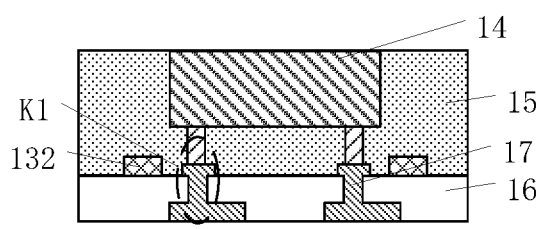
FIG. 34 illustrates a cross-section view of an exemplary chip package structure corresponding to the chip package method in FIG. 33 consistent with various disclosed embodiments in the present disclosure.

Another embodiment of the present disclosure provides another chip package method illustrated in FIGS. 33-34. FIG. 33 illustrates another chip package method and FIG. 34 illustrates a cross-section view of the chip package structure corresponding to the chip package method in FIG. 33. As illustrated in FIGS. 33-34, the chip package method may further include:

Step S111: lifting off the organic polymer material layer 11 and the protective layer 12.

As illustrated in FIGS. 33-34, since the encapsulating layer 15 may seal the plurality of chips 14 and the entire chip package structure may already have a high sealing degree, the organic polymer material layer 11 and the protective layer 12 may be lifted off, to reduce a thickness and a volume of the entire package structure.

Figure 35:
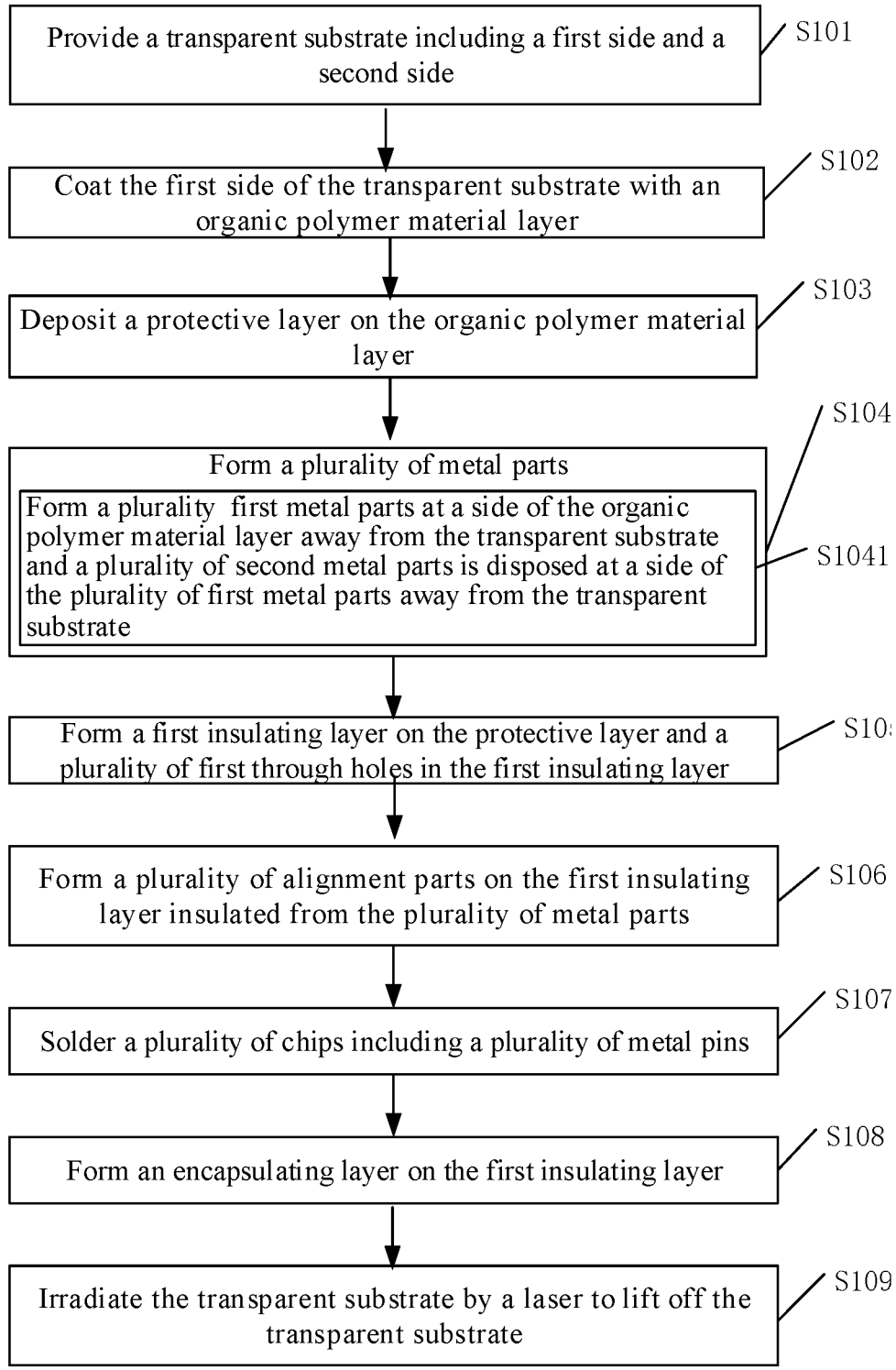
FIG. 35 illustrates another exemplary chip package method consistent with various disclosed embodiments in the present disclosure.
Figure 36:
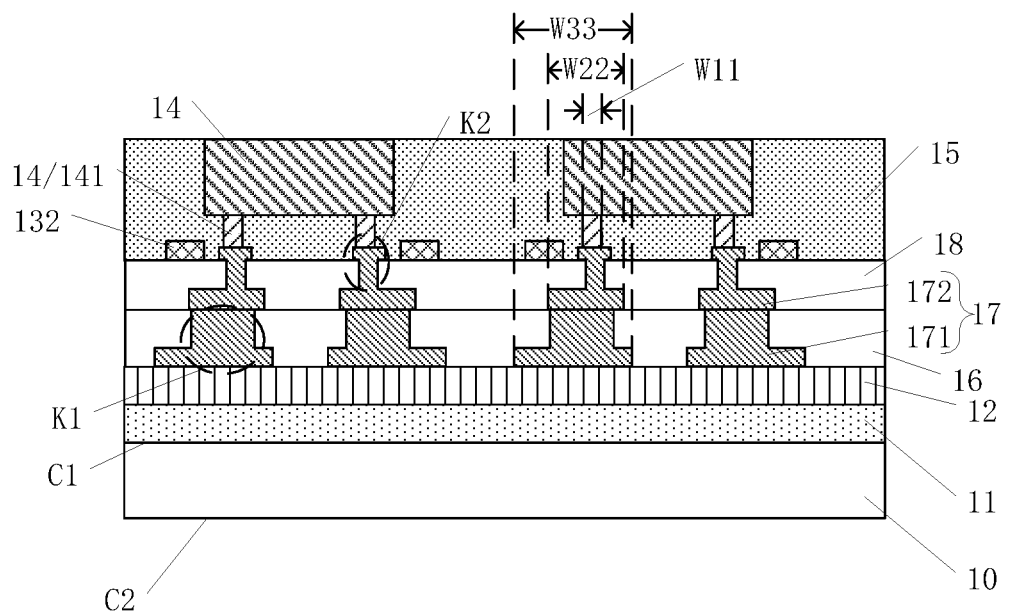
FIG. 36 illustrates a cross-section view of an exemplary chip package structure corresponding to the chip package method in FIG. 35 consistent with various disclosed embodiments in the present disclosure.

Another embodiment of the present disclosure provides another chip package method illustrated in FIGS. 35-36. FIG. 35 illustrates another chip package method and FIG. 36 illustrates a cross-section view of the chip package structure corresponding to the chip package method in FIG. 35. As illustrated in FIGS. 35-36, a process for forming the plurality of metal parts 17 in the chip package method may include:

Step S1041: forming a plurality of first metal parts 171 and a plurality of second metal parts 172. The plurality of first metal parts 171 may be formed at one side of the organic polymer material layer 11 away from the transparent substrate 10, and the plurality of second metal parts 172 may be formed at a side of the plurality of first metal parts 171 away from the transparent substrate 10. A second insulating layer 18 may be formed between the plurality of first metal parts 171 and the plurality of second metal parts 172. A plurality of second through holes K2 may be formed in the second insulating layer 18. A long the direction perpendicular to the organic polymer material layer 11, each of the plurality of first metal parts 171 may at least partially overlap a corresponding one of the plurality of metal pins 141, and each of the plurality of second metal parts 172 may at least partially overlap a corresponding one of the plurality of first metal parts 171. Each of the plurality of second metal parts 172 may be electrically connected to the corresponding one of the plurality of first metal parts 171 through corresponding one of the plurality of second through holes K2.

As illustrated in FIGS. 35-36, along a direction X1 parallel to the transparent substrate 10, a width W33 of the plurality of first metal parts 171 may be larger than a width W22 of the plurality of second metal parts 172, and the width W22 of the plurality of second metal parts 172 may be larger than a width W11 of the plurality of metal pins 141. The plurality of first metal parts 171 with the larger width may provide a larger contact area. Correspondingly, transmission of electric signal when connecting the packaged chips to other circuits and/or products may be more stable and accurate.

In the present disclosure, the process for forming the plurality of metal parts 17 may include forming the plurality of first metal parts 171 and the plurality of second metal parts 172. The second insulating layer 18 may be formed between the plurality of first metal parts 171 and the plurality of second metal parts 172. Each of the plurality of second metal parts 172 may be electrically connected to the corresponding one of the plurality of first metal parts 171, and each of the plurality of first metal parts 171 may be electrically connected to a corresponding one of the plurality of metal pins 141 to transmit electric signals from the plurality of chips 14.

In the present disclosure, the plurality of first metal parts and the plurality of second metal parts may be used to extract the electric signals from the plurality of chips, and the plurality of first metal parts with the larger width may provide a large contact area. Correspondingly, transmitted electric signals may be more accurate and usability of the chip package structure may be improved.

Figure 37:
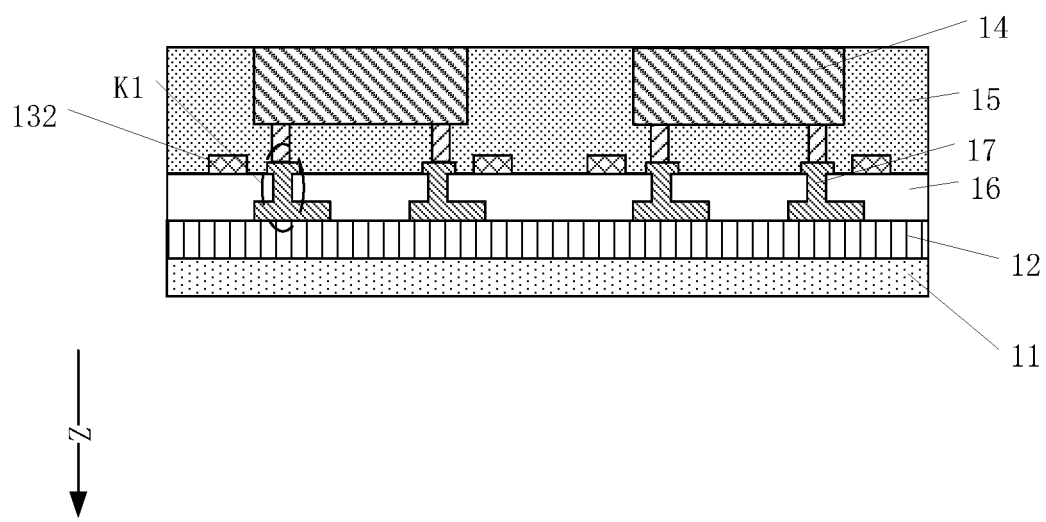
FIG. 37 illustrates a cross-section view of an exemplary chip package structure consistent with various disclosed embodiments in the present disclosure.

Another embodiment of the present disclosure provides another chip package structure illustrated in FIG. 37. As illustrated in FIG. 37 showing a cross-section views of an exemplary chip package structure provided by an embodiment in the present disclosure, the chip package structure may include: an organic polymer material layer 11, a protective layer 12 covering the organic polymer material layer 11; a plurality of metal parts 17 at a side of the protective layer 12 away from the organic polymer material layer 11; a plurality of alignment parts 132 at the one side of the protective layer 12 away from the organic polymer material layer 11; a plurality of chips 14; and an encapsulating layer 151 at a side of the plurality of metal parts 17 away from the organic polymer material layer 11. The plurality of metal parts 17 and the plurality of alignment parts 132 may be disposed at a same side. The plurality of chips 14 may be disposed at the one side of the plurality of metal parts 17 away from the organic polymer material layer 11 and may include a plurality of metal pins 141 at a side of the plurality of chips 141 away from the organic polymer material layer 11. The plurality of metal parts 17 may be electrically connected to the plurality of metal pins 141.

As illustrated in FIG. 37, the first side C1 of the transparent substrate 10 may be coated with the organic polymer material layer 11. In one embodiment, the organic polymer material layer 11 may be made of polyimide. The organic polymer material layer 11 may be made of a coating method or another suitable method, and the whole packaging structure may have a high flatness after depositing the protective layer 12 on the organic polymer material layer 11. In one embodiment, the protective layer 12 and the organic polymer material layer 11 may be made of transparent materials. The plurality of metal parts 17 may be formed on the one side of the protective layer 12 away from the organic polymer material layer 11, and the plurality of alignment parts 132 may be formed at the one side of the first insulating layer 16 away from the transparent substrate 10, to improve alignment accuracy of subsequent processes. The plurality of alignment parts 132 may be used as dedicated alignment marks for the plurality of chips. When attaching the plurality of chips 14, the plurality of chips 14 may be attached precisely according to positions of the plurality of alignment parts 132. The attachment accuracy of the plurality of chips may be improved. The reliability of the entire chip package structure and a good yield ratio of the chip package process may be improved. In one embodiment, the plurality of alignment parts 132 may be made of metal. For description purposes only, the present disclosure is illustrated by using the embodiment where the plurality of alignment parts 132 is made of metal as an example, and should not limit the scopes of the present disclosure. In various embodiments, the plurality of alignment parts 132 may be made of any suitable materials. The encapsulating layer 15 may be formed to seal the plurality of chips 14. The encapsulating layer 15 may prevent external matters (such as water and oxygen) from entering the plurality of chips 14, and avoid the influence of the external matters (such as water and oxygen) on the performance of the plurality of chips 14. The second side C2 of the transparent substrate 10 may be irradiated with a laser L to lift off the transparent substrate 10. In one embodiment, after lifting off the transparent substrate 10, the entire chip package structure may be cut by a laser cutting method, to separate the plurality of chips 14 packaged at the same time to a plurality of independently packaged chips.

In the chip package structure provided by various embodiments of the present disclosure, the encapsulating layer may be formed directly on the organic polymer material layer and the protective layer to package the plurality of chips. After lifting off the transparent substrate, a second packaging process at a side of the plurality of chips close to the transparent substrate with EMC may be avoided. The process for the chip package may be simplified and a chip package efficiency may be improved. The plurality of alignment parts may improve the alignment accuracy and the accuracy of the connection between the metal pins of the plurality of chips and the plurality of metal parts. The reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form a encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by the current technical process. The flatness of the entire chip package structure may be improved and the transparent substrate may be lifted off easily by the laser. The efficiency of the entire chip package and the good yield ratio of the chip package may be improved further.

In one embodiment illustrated in FIG. 37, along the direction Z perpendicular to the organic polymer material layer 11, an orthographic projection of each of the plurality of chips 14 to the organic polymer material layer 11 may contact orthographic projection of the at least two of the plurality of alignment parts 132 to the organic polymer material layer 11, and the at least two of the plurality of alignments parts 132 may be at different sides of the corresponding one of the plurality of chips 14.

As illustrated in FIG. 37, the plurality of alignment parts 132 may be used as dedicated alignment marks for the plurality of chips. When attaching the plurality of chips 14, the plurality of chips 14 may be attached precisely according to positions of the plurality of alignment parts 132. The plurality of metal pins 141 of the plurality of chips 14 may be precisely connected to the plurality of metal parts 17. The reliability of the entire chip package structure and a good yield ratio of the chip package process may be improved.

Figure 38:
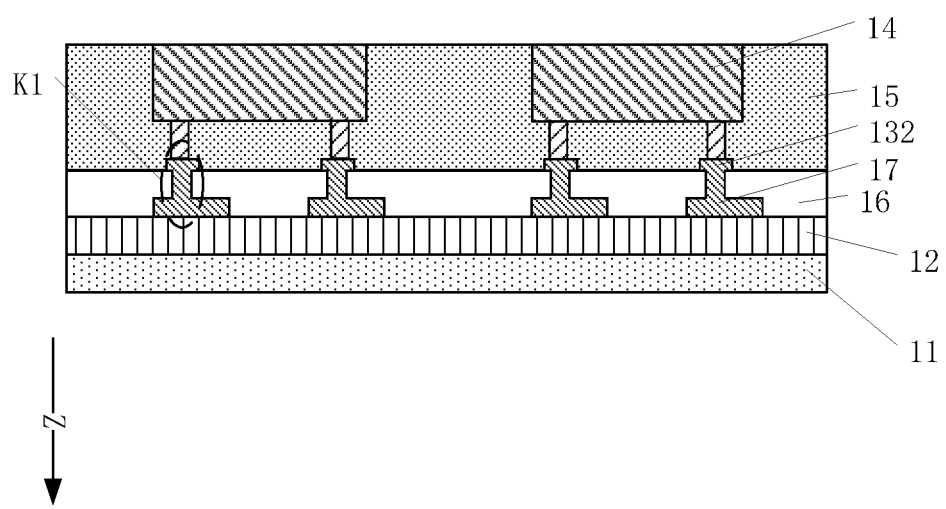
FIG. 38 illustrates a cross-section view of another exemplary chip package structure consistent with various disclosed embodiments in the present disclosure.

Another embodiment of the present disclosure provides another chip package structure illustrated in FIG. 38. As illustrated in FIG. 38 showing a cross-section views of an exemplary chip package structure, the plurality of metal parts 17 may be multiplexed as the plurality of alignment parts 132.

As illustrated in FIG. 38, the one side of the plurality of metal parts 17 away from the transparent substrate 10 may be exposed and may be electrically connected to the plurality of metal pins 141 to extract the electric signals from the plurality of chips 14. Correspondingly, an exposed portion of the plurality of metal parts 17 may be multiplexed as the plurality of alignment parts 132. The exposed portion of the plurality of metal parts 17 may be multiplexed as the plurality of alignment parts. A process of the chip package method may be simplified and the efficiency of the chip package method may be improved.

In the present disclosure, the encapsulating layer may be formed directly on the organic polymer material layer and the protective layer to package the plurality of chips. After lifting off the transparent substrate, a second packaging process at a side of the plurality of chips close to the transparent substrate with EMC may be avoided. The process for the chip package may be simplified and a chip package efficiency may be improved. The plurality of alignment parts may improve the alignment accuracy and the accuracy of the connection between the metal pins of the plurality of chips and the plurality of metal parts. The reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form a encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by current technical process. The flatness of the entire chip package structure may be improved and the transparent substrate may be lifted off easily by the laser. The efficiency of the entire chip package and the good yield ratio of the chip package may be improved further.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A chip package method, comprising:
providing a transparent substrate including a first side and a second side opposite to the first side;
coating the first side of the transparent substrate with an organic polymer material layer;
depositing a protective layer on the organic polymer material layer;
forming a plurality of alignment parts on a side of the protective layer away from the organic polymer material layer;
attaching a plurality of chips on the protective layer, wherein each of the plurality of chips includes a plurality of metal pins, and the each of the plurality of chips is in physical contact with at least two of the plurality of alignment parts located at different sides of the each of the plurality of chips;
forming an encapsulating layer at the side of the protective layer away from the organic polymer material layer;
polishing the encapsulating layer to expose the plurality of metal pins;
forming a first insulating layer;
forming a plurality of first through holes in the first insulating layer;
forming a plurality of metal parts extending along sidewalls of the plurality of first through holes, wherein the plurality of metal parts is insulated from each other and is electrically connected to the plurality of metal pins; and
irradiating the second side of the transparent substrate by a laser to lift off the transparent substrate.

2. The method according to claim 1, wherein:
forming the plurality of metal parts includes forming a plurality of first metal parts and a plurality of second metal parts, wherein:
the plurality of first metal parts is disposed at a side of the first insulating layer away from the plurality of chips and the plurality of second metal parts is disposed at a side of the plurality of first metal parts away from the plurality of chips;
a second insulating layer is disposed between the plurality of first metal parts and the plurality of second metal parts;
a plurality of second through holes is formed in the second insulating layer;

along a direction perpendicular to the organic polymer material layer, each of the plurality of first metal parts at least partially overlaps a corresponding one of the plurality of metal pins; and
the plurality of second metal parts is electrically connected to the plurality of first metal parts through the plurality of second through holes.

3. A chip package method, comprising:
providing a transparent substrate including a first side and a second side opposite to the first side;
coating the first side of the transparent substrate with an organic polymer material layer;
depositing a protective layer on the organic polymer material layer;
forming a plurality of metal parts, insulated from each other;
forming a first insulating layer on a side of the protective layer away from the transparent substrate and forming a plurality of first through holes in the first insulating layer;
forming a plurality of alignment parts on the first insulating layer, wherein the plurality of metal parts is insulated from the plurality of alignment parts;
soldering a plurality of chips including a plurality of metal pins to the insulating layer, wherein each of the plurality of chips is in physical contact with at least two of the plurality of alignment parts located at different sides of the each of the plurality of chips, along a direction perpendicular to the organic polymer material layer, each of the plurality of metal pins at least partially overlaps a corresponding one of the plurality of first through holes and each of the plurality of metal parts extends along sidewalls of a corresponding one of the plurality of first through holes to be electrically connected to a corresponding one of the plurality of metal pins;
forming an encapsulating layer at the side of the first insulating layer away from the organic polymer material layer; and
irradiating the second side of the transparent substrate by a laser to lift off the transparent substrate.

4. The chip package method according to claim 3, further including:
forming a plurality of third through holes in the organic polymer material layer, wherein along the direction perpendicular to the organic polymer material layer, each of the plurality of third through holes at least partially overlaps a corresponding one of the plurality of metal parts; and
forming a plurality of fourth through holes in the protective layer, wherein along the direction perpendicular to the organic polymer material layer, each of the plurality of fourth through holes overlaps a corresponding one of the plurality of third through holes.

5. The chip package method according to claim 3, further including:
lifting off the organic polymer material layer; and
forming a plurality of fourth through holes in the organic polymer material layer, wherein along the direction perpendicular to the organic polymer material layer, each of the plurality of fourth through holes at least partially overlaps a corresponding one of the plurality of metal parts.

6. The chip package method according to claim 3, further including lifting off the organic polymer material layer and the protective layer.

7. The chip package method according to claim 3, wherein:
- forming the plurality of metal parts includes forming a plurality of first metal parts and a plurality of second metal parts, wherein:
- the plurality of first metal parts is disposed at a side of the organic polymer material layer away from the transparent substrate and the plurality of second metal parts is disposed at a side of the plurality of first metal parts away from the transparent substrate;
- a second insulating layer is disposed between the plurality of first metal parts and the plurality of second metal parts;
- a plurality of second through holes is formed in the second insulating layer;
- along the direction perpendicular to the organic polymer material layer, each of the plurality of first metal parts at least partially overlaps a corresponding one of the plurality of metal pins; and
- the plurality of second metal parts is electrically connected to the plurality of first metal parts through the plurality of second through holes.

8. The method according to claim 1, wherein:
- the plurality of alignment parts further include a general alignment part used as a general alignment mark for chip package processes, and
- the at least two of the plurality of alignment parts are used as alignment marks for the plurality of chips.

\* \* \* \* \*